(12) United States Patent
He et al.

(10) Patent No.: US 10,937,515 B1
(45) Date of Patent: Mar. 2, 2021

(54) FUSE LATCH CIRCUITS AND RELATED APPARATUSES, SYSTEMS, AND METHODS

(71) Applicant: Micron Technology, Inc., Boise, ID (US)

(72) Inventors: Yuan He, Boise, ID (US); Hiroshi Akamatsu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/794,860

(22) Filed: Feb. 19, 2020

(51) Int. Cl.
*G11C 17/16* (2006.01)
*G11C 11/419* (2006.01)
*G11C 17/18* (2006.01)
*G11C 11/412* (2006.01)

(52) U.S. Cl.
CPC .......... *G11C 17/16* (2013.01); *G11C 11/412* (2013.01); *G11C 11/419* (2013.01); *G11C 17/18* (2013.01)

(58) Field of Classification Search
None
See application file for complete search history.

(56) References Cited

U.S. PATENT DOCUMENTS

| 7,855,574 | B2 * | 12/2010 | Santurkar | ............ | H03K 19/094 326/68 |
| 2018/0076797 | A1 * | 3/2018 | Watkins | ............... | H03K 3/0375 |
| 2018/0152187 | A1 * | 5/2018 | Yang | .................... | H01L 29/0619 |
| 2019/0198491 | A1 * | 6/2019 | Do | ........................ | G11C 11/412 |

* cited by examiner

*Primary Examiner* — Tan T. Nguyen
(74) *Attorney, Agent, or Firm* — TraskBritt

(57) ABSTRACT

Fuse latch circuits and related systems, methods, and apparatuses are disclosed. An apparatus includes a half interlock latch circuit including a first half and a second half. The first half of the half interlock latch circuit is configured to operate in a high impedance state responsive to operation of the second half of the half interlock latch circuit in a driven state. The second half of the half interlock latch circuit is configured to operate in a high impedance state responsive to operation of the first half of the half interlock latch circuit in a driven state.

20 Claims, 12 Drawing Sheets

US 10,937,515 B1

FUSE LATCH CIRCUITS AND RELATED APPARATUSES, SYSTEMS, AND METHODS

FIELD

The disclosure relates generally to latch circuits, and more specifically to latch circuits to read data stored in fuses in memory devices.

BACKGROUND

Fuse latches may be used to read information stored in fuses. In a fuse bank of a semiconductor device, each fuse may have a corresponding fuse latch for reading the information therefrom. Circuitry for fuse latches may occupy a relatively large area on a semiconductor chip, which may be a factor inhibiting increased fuse bank chip density.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
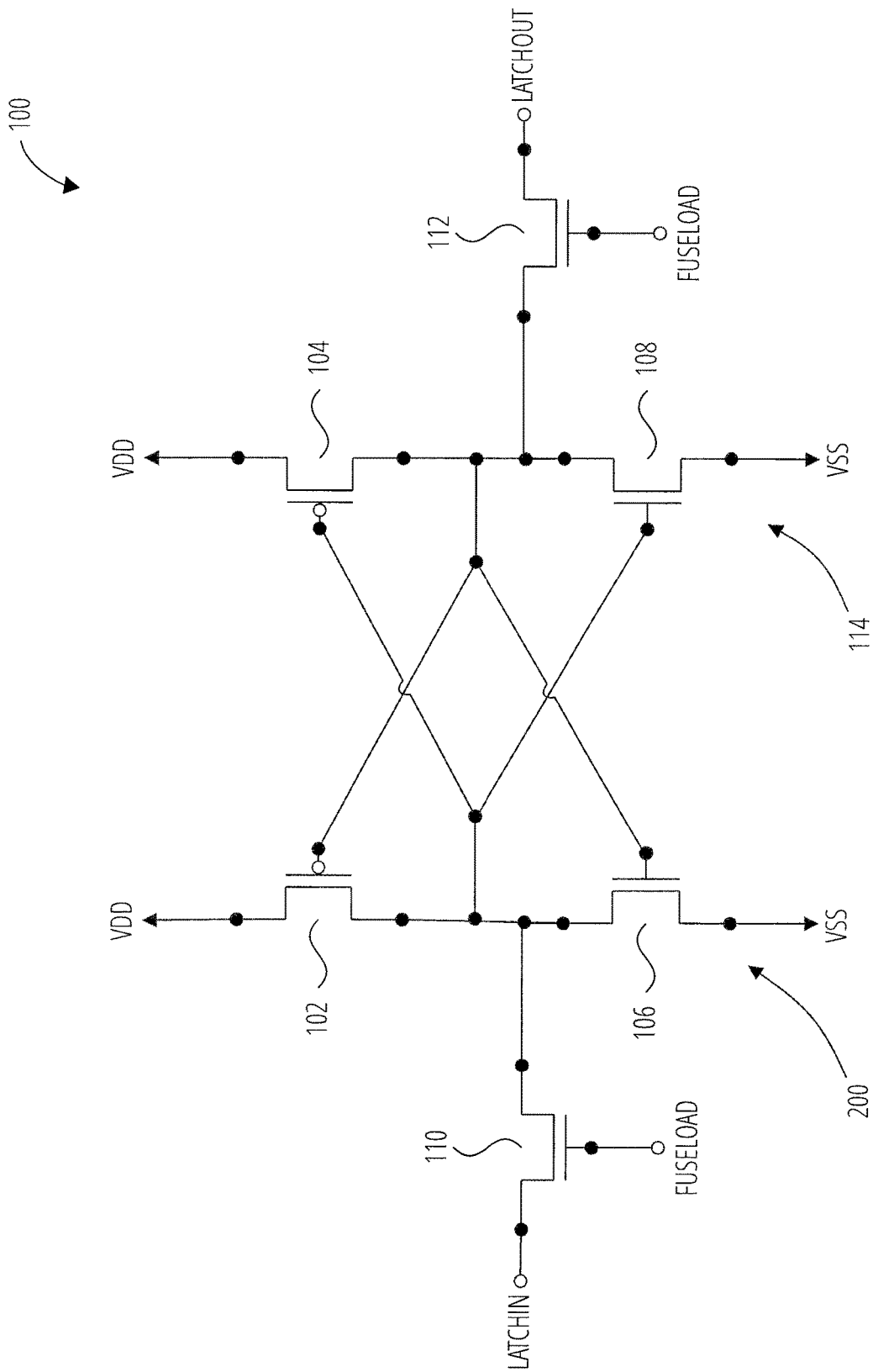
FIG. 1 is a schematic illustration of an SRAM latch circuit, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawing could be arranged and designed in a wide variety of different configurations. Thus, the following description of various embodiments is not intended to limit the scope of the present disclosure, but is merely representative of various embodiments. While the various aspects of the embodiments may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, etc. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, the term "semiconductor material" refers to a material having a conductivity between those of electrically insulating materials and electrically conductive materials. For example, a semiconductor material may have a conductivity of between about $10^{-8}$ Siemens per centimeter (S/cm) and $10^4$ S/cm at room temperature (e.g., substantially twenty degrees centigrade). Examples of semiconductor materials include element semiconductor materials found in column IV of the period table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_xGa_{1-x}As$), and quaternary compound semiconductor materials (e.g., $Ga_xIn_{1-x}As_yP_{1-y}$), without limitation. Compound semiconductor materials may include combinations of elements from columns III and V of the period table of elements (III-V semiconductor materials) or from columns II and VI of the period table of elements (II-VI semiconductor materials), without limitation. Semiconductor devices often include crystalline semiconductor materials. By way of non-limiting examples, transistors and diodes include crystalline semiconductor materials. Accordingly, the term "semiconductor material," as used herein, refers specifically to crystalline semiconductor materials unless explicitly indicated otherwise herein.

As used herein, the term "intrinsic semiconductor material" refers to a semiconductor material having a relatively small density of impurities (e.g., a lower density of impurities than electron and hole densities resulting from thermal generation at room temperature).

As used herein, the term "doped semiconductor material" refers to a semiconductor material having a higher density of impurities introduced thereto than intrinsic semiconductor materials (e.g., a higher density of impurities than electron and hole densities resulting from thermal generation at room temperature). A doped semiconductor material may be doped predominantly with donor impurities such as phosphorus (P), antimony (Sb), bismuth (Bi), and arsenic (As), without limitation. Each donor impurity in a crystal lattice of semiconductor material adds a free electron, which increases the conductivity of the semiconductor material relative to the intrinsic form of the semiconductor material. Doped semiconductor materials that have been doped predominantly with donor impurities are referred to herein as "N-type semiconductor materials." A doped semiconductor may instead be doped predominantly with trivalent or acceptor impurities such as boron (B), indium (In), aluminum (Al), and gallium (Ga), without limitation. Each trivalent or acceptor impurity in a crystal lattice of semiconductor material adds an electron hole (referred to herein as "hole"), which increases the conductivity of the semiconductor material relative to the intrinsic form of the semiconductor material. Doped semiconductor materials that have been doped predominantly with trivalent or acceptor impurities are referred to herein as "P-type semiconductor materials."

As used herein, the term "active material" refers to a semiconductor material that has been doped to function as a channel material in a metal oxide semiconductor (MOS) field effect transistor (FET) (MOSFET). A MOSFET transistor having a channel material that has been doped predominantly with donor impurities is referred to herein as an N-type MOS (NMOS) transistor because the active material serving as the channel material for the NMOS transistor includes N-type semiconductor material. Similarly, a MOSFET transistor having a channel material that has been doped predominantly with trivalent or acceptor impurities is referred to herein as a P-type MOS (PMOS) transistor because the active material serving as the channel material for the PMOS transistor includes P-type semiconductor material.

As used herein, the term "fuse" refers to a device that has a first electrical resistance in a default state and a second electrical resistance that is different from the first electrical resistance in a blown state. In some embodiments the first electrical resistance (default state) may be lower than the second electrical resistance (blown state). In some embodiments the first electrical resistance (default state) may be higher than the second electrical resistance (blown state), such as with an antifuse. One non-limiting example of a fuse is a MOSFET capacitor (MOSCap), which has a relatively high electrical resistance in its default state and a lower electrical resistance in its blown state. The different states of a fuse may be electrically set (e.g., by providing appropriate electrical signals to the fuse such as a fuse blowing voltage potential). Also, the different states (default state, blown state) of a fuse are electrically measurable because of the difference in electrical resistance between the different states, which may be measured by applying electrical signals (e.g., voltage potential biases, electrical current biases) and measuring a response of the fuse to the electrical signals. A latch circuit may be used to measure and actively store a response signal responsive to read potentials applied to a fuse. Accordingly, a fuse may be used to permanently store a bit of information by associating different logical levels (e.g., a "1" and a "0") to the different states (e.g., default and blown) of the fuse. An array or bank of fuses may be used to permanently store multiple bits of information.

Memory devices such as dynamic random access memory (DRAM) devices may use fuse banks to store bits that are pertinent to their operation. As one example, fuse banks may be used to store information indicating offsets of input buffers of a memory device, without limitation. As another example, fuse banks may be used to store addresses of memory cells that need to be repaired. Since each fuse in a fuse bank, however, has a corresponding latch circuit to read bits stored thereon, latch circuitry may occupy a relatively large amount of chip area in the memory device in opposition to demand for ever higher density memory device chips.

A relatively low failure in time (FIT) may be helpful to reduce uncorrectable error correction code (UECC) errors in fuse latches of memory devices. For a fuse latch, FIT is proportional to an N+ area scale (i.e., channel area of transistors of the fuse circuit), and inversely proportional to a critical charge (Qcrit) scale of the fuse latch. Qcrit is an amount of charge required to flip a stored bit of the fuse latch. As used herein, the term "flip," when used with reference to a bit, refers to a transition from a first logic level voltage potential to a different logic level voltage potential (e.g., from a logic level high voltage potential to a logic level low voltage potential or vice versa). With transistor size reduction, the N+ area of transistors has decreased, which serves to reduce the FIT. Drivability of fuse latches, however, may be weakened responsive to the reduction in N+ area. Accordingly, in the design of fuse latches, a tradeoff exists between FIT and occupied chip area (and total die size, by extension).

Disclosed herein are latch circuits that enable improved fuse bank densities and/or prevent soft error upsets (SEUs) in memory devices. In some embodiments a latch circuit that may be used to read a data bit stored on a fuse may include a dual interlocked storage cell (DICE) latch. DICE Latches have relatively good resistance to soft error upsets (SEUs), which contribute to UECC errors in memory devices. DICE latches, however, include twelve transistors in addition to access transistors, rendering the use of DICE latches difficult given high fuse bank density design constraints.

In other embodiments a latch circuit that may be used to read a data bit stored on a fuse includes a static random access memory (SRAM) latch. Some SRAM latches may include four transistors in addition to access transistors, which is a third the number of transistors of DICE latches. SRAM latches also may occupy less chip area than D-type flipflop latches. As a result, SRAM latches may enable higher density fuse banks than DICE latches and D-type flipflop latches. SRAM latches, however, may be more vulnerable to SEUs (and UECC errors by extension) than DICE latches, though less vulnerable to SEUs and UECC errors than D-type flipflop latches.

In yet other embodiments a latch circuit that may be used to read a data bit stored on a fuse includes a half interlock latch circuit. The half interlock latch circuit may include two pairs of parallel-connected transistors with a first transistor of each pair including an NMOS transistor and a second transistor of each pair including a PMOS transistor. As a result, each pair of transistors may function similarly to a half-on complementary MOS (CMOS) transmission gate. Each pair of transistors may resist transfer of injected current pulses from half of the half interlock latch circuit to the other half of the half interlock latch circuit. The term "half," as used herein with reference to portions of a latch circuit, does not necessarily refer to exactly one half of the latch circuit. Rather, the term "half," as used herein, refers to a portion or segment of the latch circuit. In total, the half interlock latch circuit may include ten (10) transistors in addition to access transistors. Accordingly, the half interlock latch circuit may occupy more chip area than an SRAM latch circuit, but less chip area than a DICE latch. The half interlock latch circuit may also manifest a bias issue, but may be more resistant to SEUs than SRAM latches.

In yet other embodiments a latch circuit that may be used to read a data bit stored on a fuse includes another half interlock latch circuit. The half interlock latch circuit may include four pairs of series-connected transistors. Two of the pairs of series-connected transistors correspond to a first half of the half interlock latch circuit, and the other two pairs of series-connected transistors correspond to a second half of the interlock latch circuit. The first half of the interlock latch circuit may operate in a high impedance (HiZ) state if the second half of the interlock latch circuit is operating in a driven state, and the second half of the interlock latch circuit may operate in the HiZ state if the first half of the half interlock latch circuit is operating in the driven state. Accordingly, transfer of injected current pulses from a driven half to a HiZ half of the half interlock latch circuit may be resisted because the injected current may not flip the state of the HiZ half of the half interlock latch circuit unless sufficient current is injected to assert gates of one of the pairs of series connected transistors of the HiZ half. In total, the half interlock latch circuit may include ten (10) transistors in addition to access transistors. Accordingly, the half interlock latch circuit may occupy more chip area than an SRAM latch circuit, but less chip area than a DICE latch. The half interlock latch circuit may be more resistant to SEUs than SRAM latches and may not manifest a bias issue.

FIG. 1 is a schematic illustration of an SRAM latch circuit 100, according to some embodiments. As compared to a D-type flip-flop latch, an SRAM latch may occupy less area on a semiconductor chip and have a better (lower) soft error rate (e.g., due to a higher critical charge (Qcrit) required to flip a stored bit). The SRAM latch circuit 100 includes a CMOS inverter 200 cross coupled with another CMOS inverter 114. The CMOS inverter 200 includes an NMOS transistor 106 and a PMOS transistor 102. A drain of the NMOS transistor 106 is electrically connected to a drain of the PMOS transistor 102, and a gate of the NMOS transistor 106 is electrically connected to a gate of the PMOS transistor 102. A source of the PMOS transistor 102 is electrically connected to high voltage potential power source node VDD and a source of the NMOS transistor 106 is connected to low voltage potential power source node VSS. Similarly, the CMOS inverter 114 includes an NMOS transistor 108 and a PMOS transistor 104. A drain of the NMOS transistor 108 is electrically connected to a drain of the PMOS transistor 104, and a gate of the NMOS transistor 108 is electrically connected to a gate of the PMOS transistor 104. A source of the PMOS transistor 104 is electrically connected to VDD and a source of the NMOS transistor 108 is electrically connected to VSS. By way of non-limiting example, VDD and VSS may be configured to carry direct current (DC) power voltage potentials (e.g., substantially one volt and zero volts, respectively, without limitation).

As previously mentioned, the CMOS inverter 200 and the CMOS inverter 114 are cross-coupled with each other. In other words, the gates of the PMOS transistor 102 and the NMOS transistor 106 are electrically connected to the drains of the PMOS transistor 104 and the NMOS transistor 108, and the gates of the PMOS transistor 104 and the NMOS transistor 108 are electrically connected to the drains of the PMOS transistor 102 and the NMOS transistor 106.

The SRAM latch circuit 100 also includes an access transistor 110 configured to selectively electrically connect the drains of the NMOS transistor 106 and the PMOS transistor 102 and the gates of the NMOS transistor 108 and the PMOS transistor 104 to an input node LATCHIN of the SRAM latch circuit 100. The SRAM latch circuit 100 further includes an access transistor 112 configured to selectively electrically connect the drains of the NMOS transistor 108 and the PMOS transistor 104 and the gates of the NMOS transistor 106 and the PMOS transistor 102 to an output node LATCHOUT of the SRAM latch circuit 100. Accordingly, access transistor 110 and access transistor 112 are configured to provide access to the CMOS inverter 200 and the CMOS inverter 114. Gates of the access transistor 110 and the access transistor 112 may be operably coupled to a node FUSELOAD. A voltage assertion at node FUSELOAD may cause the access transistor 110 and the access transistor 112 to conduct, enabling access to the CMOS inverter 200 and the CMOS inverter 114.

In operation, the SRAM latch circuit 100 may read information from a fuse associated with the SRAM latch circuit 100 (e.g., the fuse electrically connected to node LATCHIN). For example, electrical signals associated with a read operation of the fuse may be applied to the fuse, and a voltage potential on node FUSELOAD may be asserted to cause the access transistor 110 and the access transistor 112 to conduct. Accordingly, the fuse may be electrically connected to the drains of NMOS transistor 106 and PMOS transistor 102 and the gates of NMOS transistor 108 and PMOS transistor 104 (i.e., via node LATCHIN and the access transistor 110).

If a response of the fuse to the electrical signals associated with a read operation result in a logic level high voltage potential (e.g., a logic level "1" or "H") of node LATCHIN, NMOS transistor 108 may conduct, drawing the drains of NMOS transistor 108 and PMOS transistor 104 and the gates of NMOS transistor 106 and PMOS transistor 102 to VSS (e.g., a logic level "0" or "L"). In turn, the PMOS transistor 102 may conduct, drawing the drains of NMOS transistor 106 and PMOS transistor 102 and the gates of NMOS transistor 108 and PMOS transistor 104 to VDD (e.g., a logic level "1" or "H"). At LATCHOUT a logic level complementary to that at LATCHIN (e.g., a logic level "0" or "L") may be read. Accordingly, the information bit stored on the fuse may be determined by reading the voltage potential at LATCHOUT. After deassertion of the voltage potential on node FUSELOAD (isolating the CMOS inverter 200 and the CMOS inverter 114 from the fuse), the CMOS inverter 200 and the CMOS inverter 114 will continue to drive voltage potentials. As a result, the information bit stored by the fuse may be read by asserting the voltage potential on node FUSELOAD.

If, however, a response of the fuse to the electrical signals associated with a read operation result in a logic level low voltage potential (e.g., a logic level "0") of node LATCHIN, PMOS transistor 104 may conduct, drawing the drains of NMOS transistor 108 and PMOS transistor 104 and the gates of NMOS transistor 106 and PMOS transistor 102 to VDD (e.g., a logic level "1"). In turn, the NMOS transistor 106 may conduct, drawing the drains of NMOS transistor 106 and PMOS transistor 102 and the gates of NMOS transistor 108 and PMOS transistor 104 to VDD (e.g., a logic level "1"). At LATCHOUT a logic level complementary to that at LATCHIN (e.g., a logic level "1") may be read.

Figure 2:
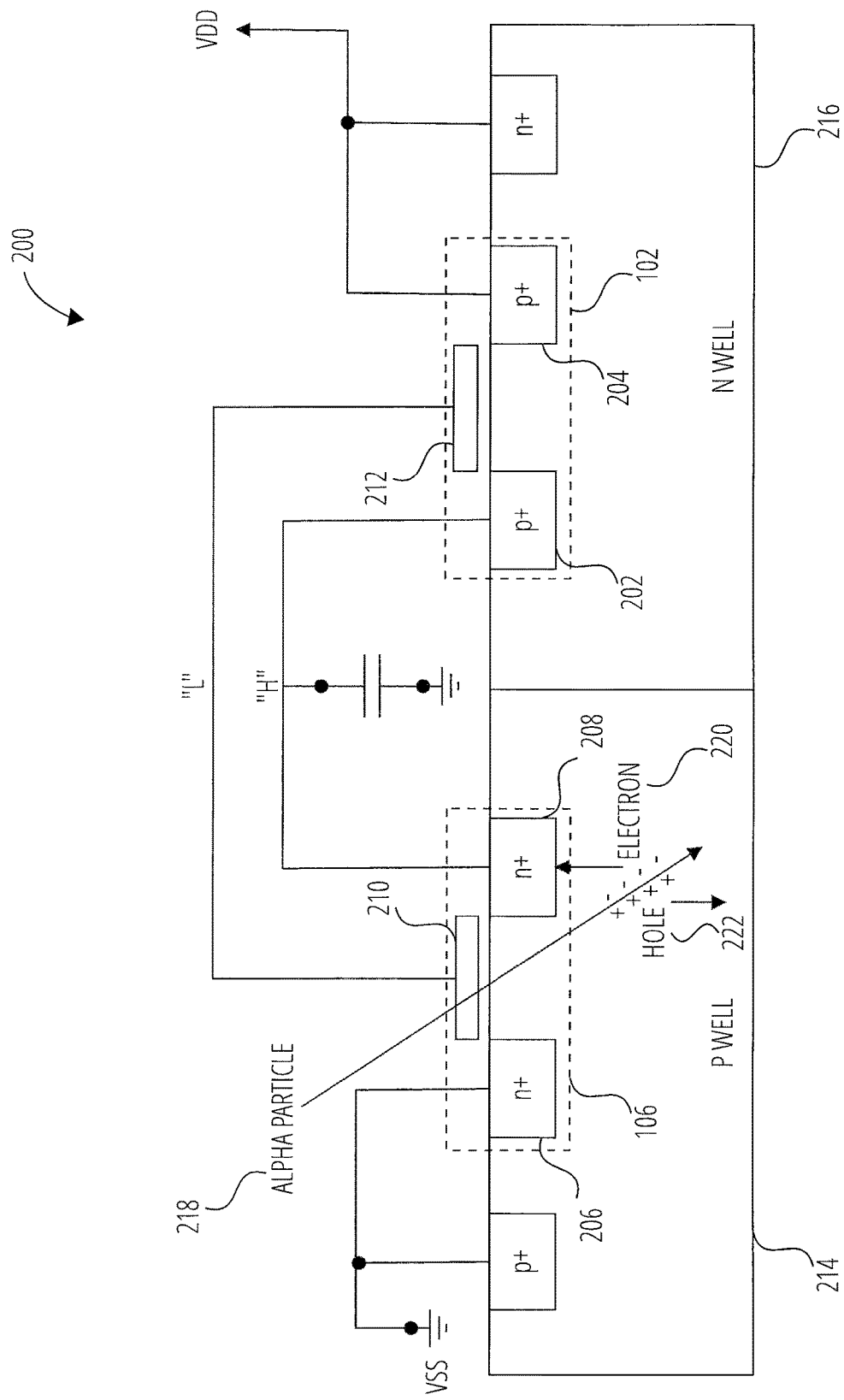
FIG. 2 is a cross-sectional view illustrating a soft error resulting from an alpha particle striking an NMOS transistor of a CMOS inverter of the SRAM latch circuit of FIG. 1.
Figure 3:
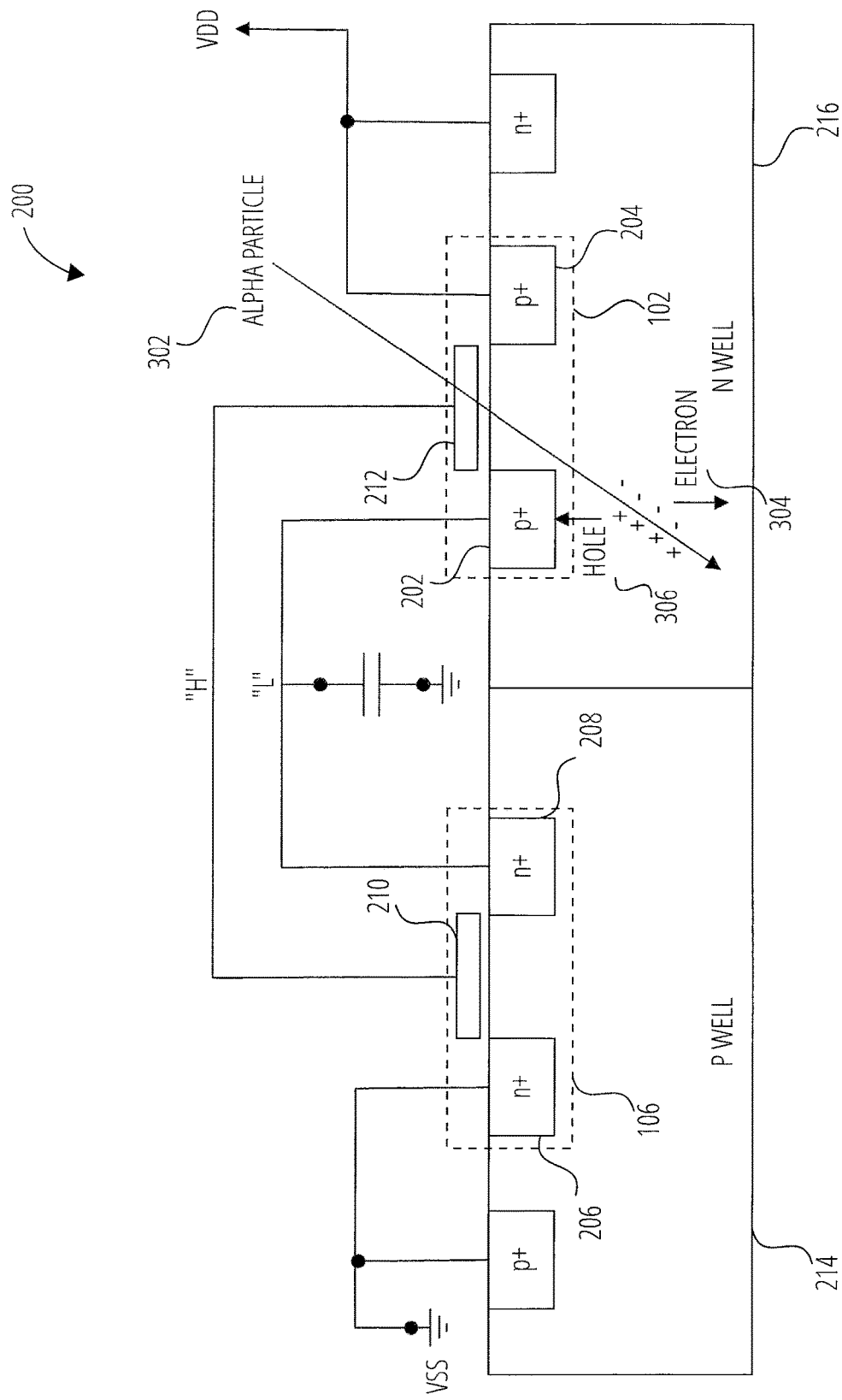
FIG. 3 is a cross-sectional view illustrating a soft error resulting from an alpha particle striking a PMOS transistor of the CMOS inverter of the SRAM latch circuit of FIG. 1.

As long as the power supplies (VDD and VSS) continue to supply power, the SRAM latch circuit 100 will continue to store the information bit read from its fuse. A neutron or alpha particle striking one of the PMOS transistor 102, the PMOS transistor 104, the NMOS transistor 106, or the NMOS transistor 108 may, however, trigger the voltage potentials in the SRAM latch circuit 100 to flip, which may result in a soft error, and in turn a UECC error. FIG. 2 and FIG. 3 below illustrate examples of soft errors of the SRAM latch circuit 100 resulting from alpha particle strikes.

FIG. 2 is a cross-sectional view illustrating a soft error resulting from an alpha particle 218 striking the NMOS transistor 106 of the CMOS inverter 200 of FIG. 1. As previously discussed, the CMOS inverter 200 includes NMOS transistor 106 and PMOS transistor 102. The NMOS transistor 106 includes a gate 210 (e.g., comprising electrically conductive material such as polysilicon or metal, without limitation), a source 206, and a drain 208 (e.g., the source 206 and the drain 202 including n-type semiconductor material). The source 206 and the drain 208 are formed in a P well 214. The PMOS transistor 102 includes a gate 212 (e.g., including electrically conducive material such as polysilicon or metal, without limitation), a source 204, and a drain 202 (e.g., the source 204 and the drain 202 including p-type semiconductor material). The source 204 and the drain 202 are formed in an N well 216.

Referring to FIG. 1 and FIG. 2 together, an alpha particle 218 may strike the NMOS transistor 106, causing an electron 220 and a hole 222 to form in the P well 214. The electron may travel to the drain 208, increasing a negative charge of the drain 208. If the electron 220 causes the amount of charge on the drain 208 to increase to a critical charge (Qcrit) of the CMOS inverter 114, the CMOS inverter 114 may drive gate 210 and gate 212 to a logic level low (e.g., "0" or "L") and the CMOS inverter 200 may in turn drive drain 208 and drain 202 to a logic level high (e.g., "1" or "H"), as illustrated in FIG. 2. If the CMOS inverter 200 was storing a logic level high (e.g., a "1" or "H") on gate 210 and gate 212 and a logic level low (e.g., a "0" or "L") on drain 208 and drain 202 previous to the strike of the alpha particle 218, the bit stored by the SRAM latch circuit 100 may flip responsive to the alpha particle 218. Accordingly, in such instances a soft error results, which in turn may result in a UECC error.

Since electric charge (Q) is equal to electrical current (I) times time (t) (Q=I*t where * is the multiplication operator), particle strikes may inject charges into the source/drain regions of a transistor (e.g., NMOS transistor 106, PMOS transistor 102, NMOS transistor 108, PMOS transistor 104). If the injected charge is sufficient to cause an injected current (I=Q/t) to exceed a source to drain current of the transistor, the noise pulse may be transferred to the input of the cross-coupled inverter to flip the SRAM latch circuit 100 and latch a false state of the SRAM latch circuit 100.

FIG. 3 is a cross-sectional view illustrating a soft error resulting from an alpha particle 302 striking a PMOS transistor 102 of the CMOS inverter 200 of FIG. 1. Referring to FIG. 1 and FIG. 3 together, an alpha particle 302 may strike the PMOS transistor 102, causing an electron 304 and a hole 306 to form in the P well 214. The hole 306 may travel to the drain 202, increasing a positive charge of the drain 202. If the hole 306 causes the amount of charge on the drain 202 to increase to a critical charge (Qcrit) of the CMOS inverter 114, the CMOS inverter 114 may drive gate 210 and gate 212 to a logic level high (e.g., "1" or "H") and the CMOS inverter 200 may in turn drive drain 208 and drain 202 to a logic level low (e.g., "0" or "L"), as illustrated in FIG. 3. If the CMOS inverter 200 was storing a logic level low (e.g., a "0" or "L") on gate 210 and gate 212 and a logic level high (e.g., a "1" or "H") on drain 208 and drain 202 previous to the strike of the alpha particle 302, the bit stored by the SRAM latch circuit 100 may flip responsive to the alpha particle 302. Accordingly, in such instances a soft error results, which in turn may result in a UECC error.

Although FIG. 2 and FIG. 3 illustrate soft errors in the CMOS inverter 200, similar soft errors may occur in the CMOS inverter 114 of FIG. 1. For example, soft errors may occur responsive to alpha particle or neutron strikes of the NMOS transistor 108 or the PMOS transistor 104 of the CMOS inverter 114. It is noted that since a carrier mobility of electrons is generally higher than a carrier mobility of holes, NMOS drivability is stronger than PMOS drivability. Accordingly, soft errors resulting from particle (e.g., alpha particles, neutrons) strikes of NMOS transistors (e.g., NMOS transistor 106, NMOS transistor 108) may be more dominant than soft errors resulting from particle strikes of PMOS transistors (e.g., PMOS transistor 102, PMOS transistor 104).

Figure 4:
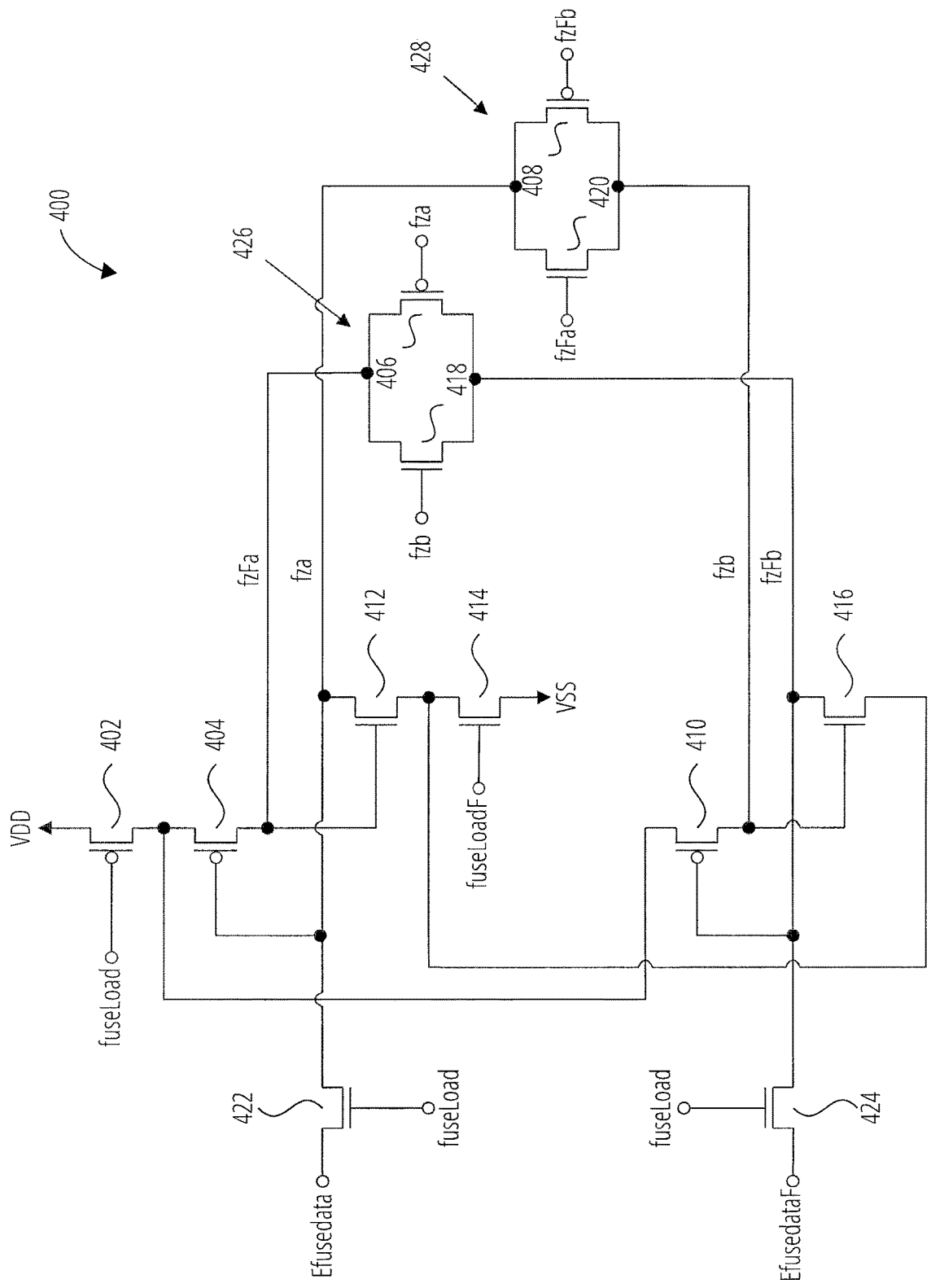
FIG. 4 is a schematic illustration of a half interlock latch circuit, according to some embodiments.

FIG. 4 is a schematic illustration of a half interlock latch circuit 400, according to some embodiments. In contrast to the SRAM latch circuit 100 of FIG. 1, the half interlock latch circuit 400 does not include cross-coupled CMOS inverters. As a result, even if particles (e.g., alpha particles, neutrons) strike a transistor of the half interlock latch circuit 400, only part of the half interlock latch circuit 400 may flip a bit stored by the half interlock latch circuit 400. After the charge resulting from the particle strikes dissipate, the half interlock latch circuit 400 may return to the correct state that it was in prior to the particle strike.

The half interlock latch circuit 400 includes ten (10) transistors and two (2) access transistors. Input nodes Efusedata and EfusedataF of the half interlock latch circuit 400 are electrically connected to access transistor 422 and access transistor 424, respectively. A fuse corresponding to the half interlock latch circuit 400 may be electrically connected to the node Efusedata. Responsive to read voltage potentials applied to the fuse, a logic level high voltage potential (e.g., "H" or "1") or a logic level low voltage potential (e.g., "L" or "0") may be provided to Efusedata depending on whether the fuse is in a blown state or a default state. Voltage potentials applied to the input nodes Efusedata and EfusedataF may be complementary to each other. Accordingly, a compliment of the voltage potential provided to Efusedata may be provided to EfusedataF. For example, an inverter (e.g., a CMOS inverter) (not shown) may be electrically connected between the input nodes Efusedata and EfusedataF to invert an input voltage potential applied to Efusedata to generate a complementary voltage potential to be applied to EfusedataF. Gates of access transistor 422 and access transistor 424 may be electrically connected to a node fuseLoad. The node fuseLoad may be asserted to cause access transistor 422 and access transistor 424 to conduct and provided access to the rest of the half interlock latch circuit 400.

A node fza of the half interlock latch circuit 400 may be electrically connected to the access transistor 422. Accordingly, responsive to an assertion of node fuseLoad, the node Efusedata may be electrically connected to the node fza through the access transistor 422. Similarly, a node fzFb of the half interlock latch circuit 400 may be electrically connected to the access transistor 424. Accordingly, responsive to an assertion of node fuseLoad, the node EfusedataF may be electrically connected to the node fzFb through the access transistor 424.

The half interlock latch circuit 400 also includes five (5) PMOS transistors (i.e., PMOS transistor 402, PMOS transistor 404, PMOS transistor 406, PMOS transistor 408, and PMOS transistor 410) and five (5) NMOS transistors (NMOS transistor 412, NMOS transistor 414, NMOS transistor 416, NMOS transistor 418, and NMOS transistor 420). A source of PMOS transistor 402 may be electrically connected to a high voltage potential power source node VDD. A gate of the PMOS transistor 402 may be electrically connected to the node fuseLoad of the half interlock latch circuit 400. Accordingly, a drain of the PMOS transistor 402 may be electrically connected to VDD responsive to an assertion of fuseLoad (an assertion for a PMOS transistor gate such as that of PMOS transistor 402 may be a logic level low voltage potential, or "L" or "0"), which is the same node used to trigger the access transistor 422 and access transistor 424 to enable access to the half interlock latch circuit 400. Similarly, a source of NMOS transistor 414 is electrically connected to a low voltage potential power source node VSS. A gate of the NMOS transistor 414 may be electrically connected to a node fuseLoadF, which is configured to carry a voltage potential that is complementary to that of the node fuseLoad. Accordingly, a drain of the NMOS transistor 414 may be electrically connected to VSS responsive to an assertion of fuseLoadF (an assertion for an NMOS transistor gate such as that of NMOS transistor 414 may be a logic level high voltage potential).

With complementary signals (signals on nodes fuseLoad and fuseLoadF) applied to gates of transistors (PMOS transistor 402 and NMOS transistor 414, respectively) connected to VDD and VSS, the PMOS transistor 402 and the NMOS transistor 414 electrically isolate the half interlock latch circuit 400 from VDD and VSS while the half interlock latch circuit 400 is being accessed (i.e., while node fuseLoad is asserted to cause access transistor 422 and access transistor 424 to conduct). Also, the PMOS transistor 402 and the NMOS transistor 414 electrically connect the rest of the half interlock latch circuit 400 to VDD and VSS while the half interlock latch circuit 400 is not being accessed (i.e., while node fuseLoad is deasserted to prevent access transistor 422 and access transistor 424 from conducting). As a result, during a read operation of a fuse electrically connected to Efusedata, the half interlock latch circuit 400 may be driven by electrical signals on nodes Efusedata and EfusedataF rather than by power rail voltage potentials on VSS and VDD. Accordingly, a bit of data may be stored by the half interlock latch circuit 400 responsive to voltage potentials applied to Efusedata and EfusedataF. After the half interlock latch circuit 400 is no longer being accessed, the half interlock latch circuit 400 is electrically connected to VDD and VSS through PMOS transistor 402 and NMOS transistor 414, and the half interlock latch circuit 400 may be driven by VDD and VSS.

PMOS transistor 404 is electrically connected between the drain of PMOS transistor 402 and a node fzFa of the half interlock latch circuit 400. A gate of the PMOS transistor 404 is electrically connected to fza. Accordingly, the PMOS transistor 404 is configured to electrically connect the drain of PMOS transistor 402 to the node fzFa responsive to a logic level low (e.g., "L" or "0") on node fza. Similarly, PMOS transistor 410 is electrically connected between the drain of PMOS transistor 402 and a node fzb of the half interlock latch circuit 400. A gate of the PMOS transistor 410 is electrically connected to the node fzFb. Accordingly, the PMOS transistor 410 is configured to electrically connect the drain of PMOS transistor 402 to the node fzb responsive to a logic level low (e.g., "L" or "0") on node fzFb.

NMOS transistor 416 is electrically connected between the drain of NMOS transistor 414 and node fzFb. A gate of the NMOS transistor 416 is electrically connected to the node fzb. Accordingly, responsive to a logic level high (e.g., "H" or "1") on node fzb, NMOS transistor 416 is configured to electrically connect the drain of NMOS transistor 414 to node fzFb. Similarly, NMOS transistor 412 is electrically connected between the drain of NMOS transistor 414 and node fza. A gate of NMOS transistor 412 is electrically connected to fzFa. Accordingly, responsive to a logic level high (e.g., "H" or "1") on node fzFa the NMOS transistor 412 is configured to electrically connect the drain of NMOS transistor 414 to node fza.

The half interlock latch circuit 400 includes a pair of transistors 426 including PMOS transistor 406 and NMOS transistor 418, which are electrically connected in parallel between node fzFa and node fzFb of the half interlock latch circuit 400. A gate of PMOS transistor 406 is electrically connected to node fza, and a gate of NMOS transistor 418 is electrically connected to fzb. Accordingly, responsive to a logic level low (e.g., "L" or "0") on node fza or a logic level high (e.g., "H" or "1") on node fzb, node fzFa may be electrically connected to node fzFb through one of PMOS transistor 406 or NMOS transistor 418. In operation, voltage potentials at nodes fza and fzb will be substantially the same (e.g., fza=fzb="H" or "1", or fza=fzb="L" or "0"). Accordingly, only one of NMOS transistor 418 and PMOS transistor 406 will be conducting at any given time (i.e., NMOS transistor 418 will be conducting and PMOS transistor 406 will not be conducting when fza=fzb="H" or "1", and PMOS transistor 406 will be conducting and NMOS transistor 418 will not be conducting when fza=fzb="L" or "0").

The half interlock latch circuit 400 also includes pair of transistors 428 including PMOS transistor 408 and NMOS transistor 420, which are electrically connected in parallel between node fza and node fzb of the half interlock latch circuit 400. A gate of PMOS transistor 408 is electrically connected to node fzFb, and a gate of NMOS transistor 420 is electrically connected to fzFa. Accordingly, responsive to a logic level low (e.g., "L" or "0") on node fzFb or a logic level high (e.g., "H" or "1") on node fzFa, node fza may be electrically connected to node fzb through one of PMOS transistor 408 or NMOS transistor 420. In operation, voltage potentials at nodes fzFa and fzFb will be substantially the same (e.g., fzFa=fzFb="H" or "1", or fzFa=fzFb="L" or "0"). Accordingly, only one of NMOS transistor 420 and PMOS transistor 408 will be conducting at any given time (i.e., NMOS transistor 420 will be conducting and PMOS transistor 408 will not be conducting when fzFa=fzFb="H" or "1", and PMOS transistor 408 will be conducting and NMOS transistor 420 will not be conducting when fzFa=fzFb="L" or "0").

Since pair of transistors 426 and pair of transistors 428 are only half on at any given time, pair of transistors 426 and pair of transistors 428 may perform similarly to half on CMOS transmission gates. As a result, pair of transistors 426 may resist transfer of a logic level low current inject pulse between nodes fzFa and fzFb, and pair of transistors 428 may resist transfer of a logic level high current inject pulse between nodes fza and fzb.

Figure 5:
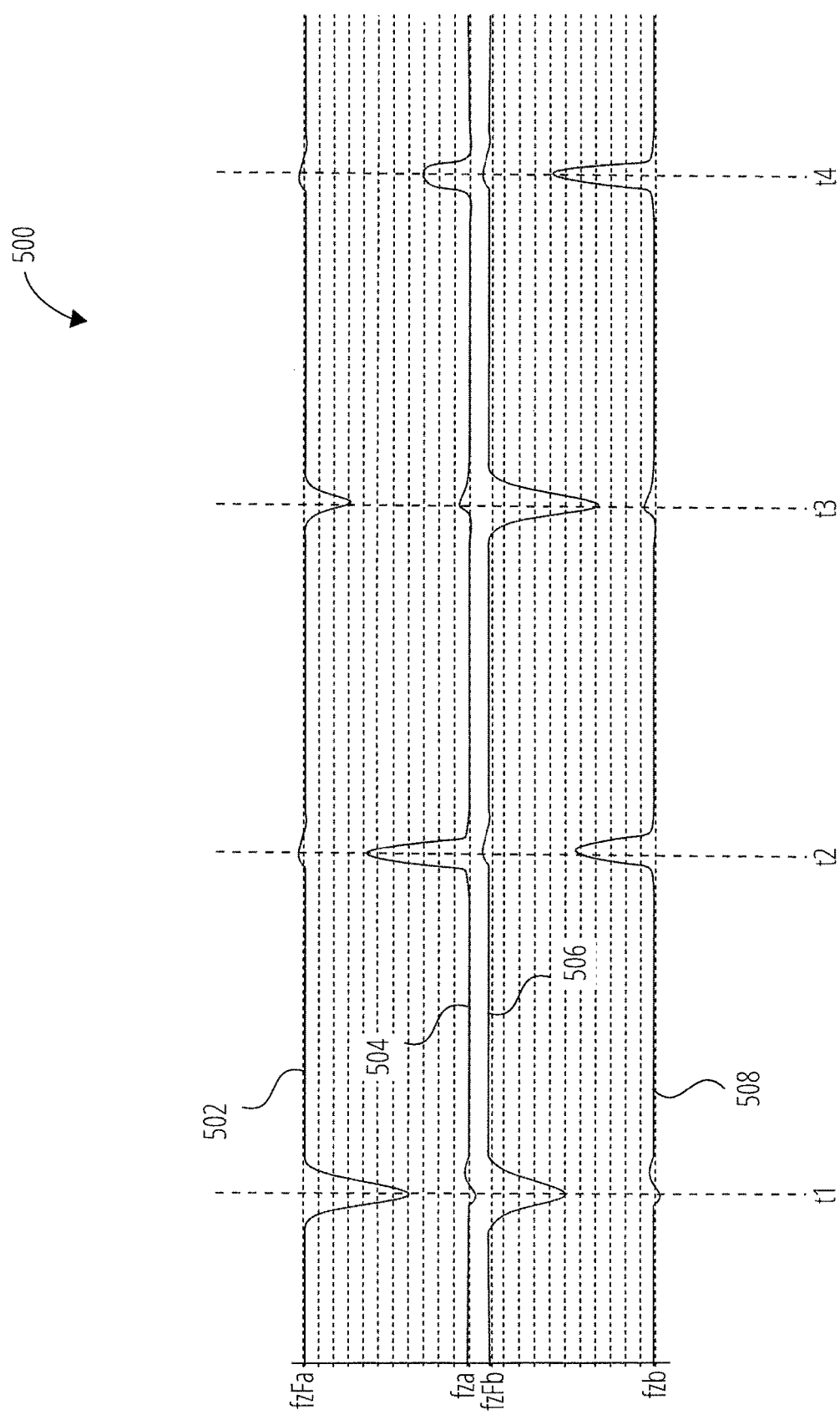
FIG. 5 is a signal timing diagram illustrating responses of voltage potentials at nodes of the half interlock latch circuit to simulated particle strikes.

FIG. 5 is a signal timing diagram 500 illustrating responses of voltage potentials at nodes of the half interlock latch circuit 400 to simulated particle strikes. In the signal timing diagram 500, voltage potentials (in increments of 100 millivolts (mV) shown by horizontal dotted lines in the signal timing diagram 500) of signals are plotted against time (with the passage of time from earlier to later illustrated from left to right in the signal timing diagram 500). Referring to FIG. 4 and FIG. 5 together, the signal timing diagram 500 illustrates a fzFa voltage potential 502 at node fzFa, a fza voltage potential 504 at node fza, a fzFb voltage potential 506 at node fzFb, and a fzb voltage potential 508 at node fzb. In the signal timing diagram 500, the fza voltage potential 504 and the fzb voltage potential 508 are illustrated as having steady state values at logic level low voltage potentials. Also, the fzFa voltage potential 502 and the fzFb voltage potential 506 are illustrated as having steady states at logic level high voltage potentials (e.g., about 1.1 volts higher than the logic level low). Accordingly, it may be determined that node Efusedata was at a logic level low and node EfusedataF was at a logic level high when an access voltage potential at node fuseLoad was asserted to read the fuse associated with the half interlock latch circuit 400.

In the signal timing diagram 500, at time t1 particle strikes are simulated (e.g., as injected current noise) on the fzFa voltage potential 502 resulting in a negative spike in the fzFa voltage potential 502 of about 700 millivolts (mV). Such particle strikes may occur on, for example, NMOS transistor 418 to induce a negative voltage spike on the fzFb voltage potential 506 at time t1. In response, a negative spike on the fzFb voltage potential 506 starts to occur at t1 because PMOS transistor 406 may conduct the spike from fzFa voltage potential 502 to fzFb voltage potential 506. The negative spike at t1 of the fzFb voltage potential 506 may have a lower amplitude (e.g., about 500 mV) than that of the spike on fzFa voltage potential 502 because the half on pair of transistors 426 may resist transfer of the spike from the fzFa voltage potential 502 to the fzFb voltage potential 506. Accordingly, rather than causing the fzFa voltage potential 502, the fzFb voltage potential 506, the fza voltage potential 504, and the fzb voltage potential 508 to flip responsive to the simulated strikes at t1, the fzFa voltage potential 502 and the fzFb voltage potential 506 return to their previous values (i.e., logic level high) after t1.

At time t2 particle strikes are simulated on the fza voltage potential 504 resulting in a positive spike on the fza voltage potential 504 of about 700 mV. Such particle strikes may occur on, for example, PMOS transistor 408 to induce a positive voltage spike on the fza voltage potential 504. In response, a positive spike on the fzb voltage potential 508 starts to occur at time t2 because NMOS transistor 420 may conduct the spike from fza voltage potential 504 to fzb voltage potential 508. The positive spike on fzb voltage potential 508 at t2 of may have a lower amplitude (e.g., about 500 mV) than that of fza voltage potential 504 because the half on pair of transistors 428 may resist transfer of the spike from the fza voltage potential 504 to the fzb voltage potential 508. Rather than causing the fzFa voltage potential 502, the fzFb voltage potential 506, the fza voltage potential 504, and the fzb voltage potential 508 to flip responsive to the simulated strikes at t2, the fza voltage potential 504 and the fzb voltage potential 508 return to their previous values (i.e., logic level low) after t2.

At time t3 particle strikes are simulated on the fzFb voltage potential 506 resulting in a negative spike on the fzFb voltage potential 506 of about 700 mV. Such particle strikes may occur on, for example, NMOS transistor 418 to induce a negative voltage spike on the fzFb voltage potential 506. In response, a negative spike on the fzFa voltage potential 502 occurs at t3, but at a lower amplitude (e.g., about 300 mV) because the half on pair of transistors 426 resists transfer of the voltage spike from fzFb voltage potential 506 to fzFa voltage potential 502. Rather than causing the fzFa voltage potential 502, the fzFb voltage potential 506, the fza voltage potential 504, and the fzb voltage potential 508 to flip responsive to the simulated strikes at t3, the fzFb voltage potential 506 and the fzFa voltage potential 502 return to their previous values (i.e., logic level high) after t3.

At time t4 particle strikes are simulated on the fzb voltage potential 508 resulting in a positive spike on the fzb voltage potential 508 of about 700 mV. Such particle strikes may occur on, for example, PMOS transistor 408 to induce a positive voltage spike on the fzb voltage potential 508. In response, a positive spike on the fza voltage potential 504 occurs at t4, but at a lower amplitude (e.g., about 300 mV) because the half on pair of transistors 428 resists transfer of the spike from fzb voltage potential 508 to fza voltage potential 504. Rather than causing the fzFa voltage potential 502, the fzFb voltage potential 506, the fza voltage potential 504, and the fzb voltage potential 508 to flip responsive to the simulated strikes at t4, the fzb voltage potential 508 and the fza voltage potential 504 return to their previous values (i.e., logic level low) after t4.

As illustrated by the signal timing diagram 500, the simulated strikes are not sufficient to flip a bit stored by the half interlock latch circuit 400. The half interlock latch circuit 400 is configured to break a cross couple connection so that a false state may not be latched, avoiding soft errors. When radiation associated with strikes are gone, the half interlock latch circuit 400 will settle back into its previous state. In fact, a critical charge (Qcrit) associated with the half interlock latch circuit 400 may be about three times higher than that of the SRAM latch circuit 100 of FIG. 1. Since the half interlock latch circuit 400 includes ten (10) transistors as compared to four (4) transistors of the SRAM latch circuit 100, however, the half interlock latch circuit 400 may occupy a larger chip area than the SRAM latch circuit 100. Accordingly, design constraints may drive selection of the SRAM latch circuit 100 or the half interlock latch circuit 400. The half interlock latch circuit 400, however, may serve as a good compromise between the small but soft error prone SRAM latch circuit 100 and the soft error resistant but large DICE latch.

Although the half interlock latch circuit 400 shows improved Qcrit and better soft error resistance as compared to those of the SRAM latch circuit 100, a high impedance ("HiZ") issue may manifest in the half interlock latch circuit 400. For example, either fza and fzFa or fzFb and fzb will be in a HiZ state depending on the state of Efusedata (e.g., logic level high, logic level low), resulting in a bias defect between current inject locations on a driven side or a HiZ side of the half interlock latch circuit 400.

For example, in the case where nodes fza and fzb are set to a logic level low voltage potential and nodes fzFa and fzFb are set to a logic level high voltage potential, PMOS transistor 404 (having its gate connected to node fza, which is at a logic level low voltage potential) and NMOS transistor 412 (having its gate connected to node fzFa, which is at a logic level high voltage potential) are driving. Accordingly, a top half of the half interlock latch circuit 400 including PMOS transistor 404 and NMOS transistor 412 is in a driving state. In contrast, PMOS transistor 410 (having its gate connected to node fzFb, which is at a logic level high voltage potential) and NMOS transistor 416 (having its gate connected to node fzb, which is at a logic level low voltage potential) are in a HiZ state. According, a bottom half of the half interlock latch circuit 400 including PMOS transistor 410 and NMOS transistor 416 is in a HiZ state. As a result, both of nodes fzb and fzFb, which are on the bottom half of the half interlock latch circuit 400, are in the HiZ side of the half interlock latch circuit 400, and are therefore susceptible to noise resulting from particle strikes. This noise on the HiZ side of the half interlock latch circuit 400 may not, however, be canceled by the voltage supplies from the driven half of the half interlock latch circuit 400 because the pair of transistors 426 and the pair of transistors 428 may reduce drivability to the HiZ half of the half interlock latch circuit 400 (i.e., because they are only half "on"). It is noted that where nodes fza and fzb are instead set to a logic level high voltage potential and nodes fzFa and fzFb are set to a logic level low voltage potential, PMOS transistor 404 and NMOS transistor 412 may be in a HiZ state, and PMOS transistor 410 and NMOS transistor 412 may be driving. Accordingly, the top half of the half interlock latch circuit 400 including PMOS transistor 404 and NMOS transistor 412 may be in a HiZ state and the bottom half of the half interlock latch circuit 400 including PMOS transistor 410 and NMOS transistor 416 may be in a driving state. In this situation, nodes fzFa and fza may be in the HiZ half of the half interlock latch circuit 400, and may therefore be susceptible to noise resulting from particle strikes.

Figure 6:
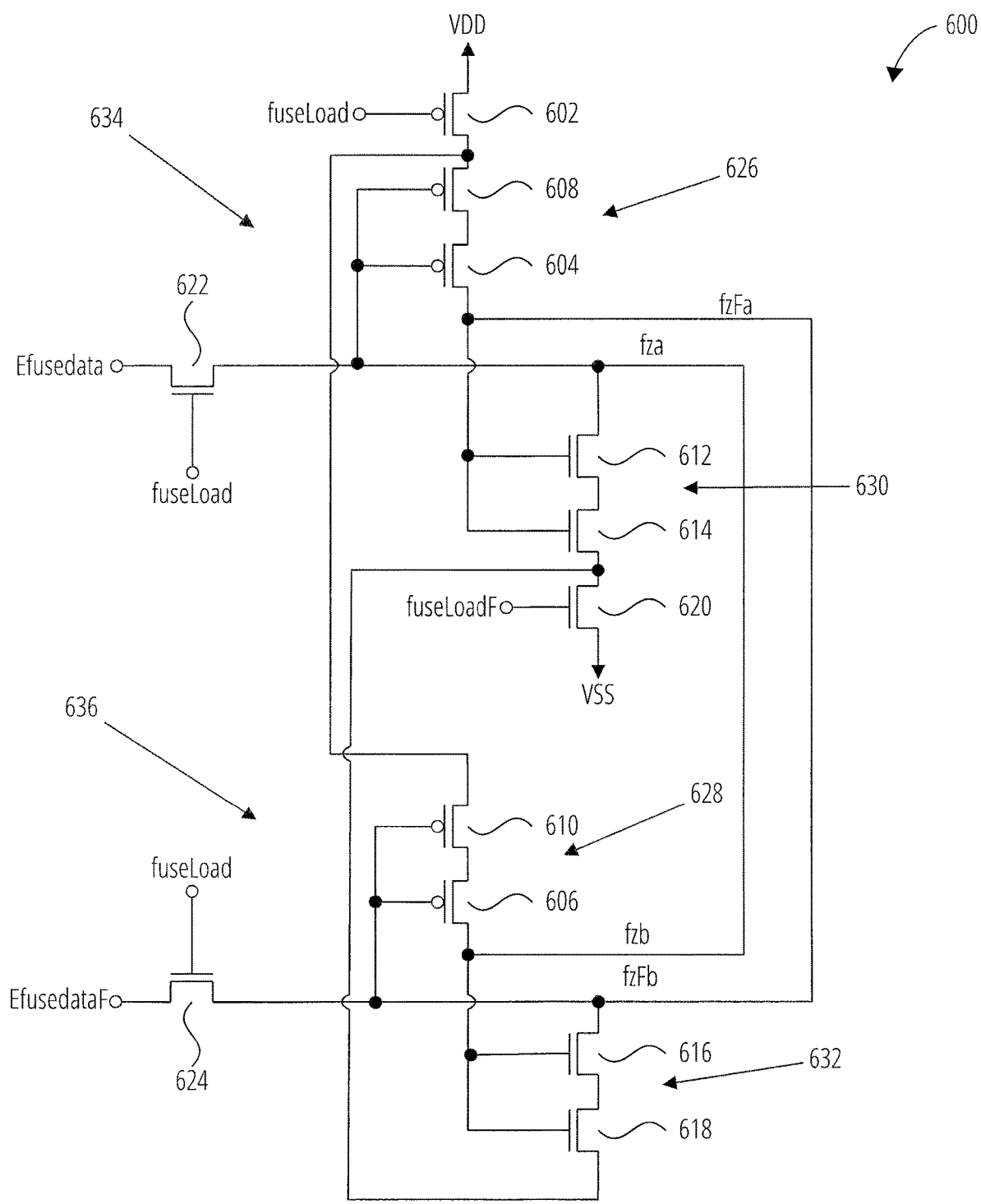
FIG. 6 is a schematic illustration of another half interlock latch circuit, according to some embodiments.

FIG. 6 is a schematic illustration of another half interlock latch circuit 600, according to some embodiments. In contrast to the SRAM latch circuit 100 of FIG. 1, the half interlock latch circuit 400 does not include cross-coupled CMOS inverters, similar to the half interlock latch circuit 400 of FIG. 4. The half interlock latch circuit 600, however, overcomes the bias defect mentioned with respect to the half interlock latch circuit 400. For example, responsive to current injection (e.g., due to particle strikes), power nodes VDD and VSS may be electrically isolated from the half interlock latch circuit 600. After the charge resulting from the particle strikes dissipate, the half interlock latch circuit 600 may return to the correct state that it was in prior to the particle strike.

Similar to the half interlock latch circuit 400 of FIG. 4, the half interlock latch circuit 600 includes ten (10) transistors and two (2) access transistors. The half interlock latch circuit 600 includes input nodes Efusedata and EfusedataF are electrically connected to access transistor 622 and access transistor 624, respectively. A fuse corresponding to the half interlock latch circuit 600 may be electrically connected to the node Efusedata. Responsive to read biases (e.g., voltage potentials, electrical currents) applied to the fuse, a logic level high voltage potential (e.g., "H" or "1") or a logic level low voltage potential (e.g., "L" or "0") may be provided to Efusedata depending on whether the fuse is in a blown state or a default state. Voltage potentials applied to the input nodes Efusedata and EfusedataF may be complementary to each other. Accordingly, a compliment of the voltage potential provided to Efusedata may be provided to EfusedataF. For example, an inverter (e.g., a CMOS inverter) (not shown) may be electrically connected between the input nodes Efusedata and EfusedataF to invert an input voltage potential applied to Efusedata to generate a complementary voltage potential to be applied to EfusedataF. Gates of access transistor 622 and access transistor 624 may be electrically connected to a node fuseLoad. The node fuseLoad may be asserted to cause access transistor 622 and access transistor 624 to conduct and provided access to the rest of the half interlock latch circuit 600.

A node fza of the half interlock latch circuit 600 may be electrically connected to the access transistor 622. Accordingly, responsive to an assertion of node fuseLoad, the node Efusedata may be electrically connected to the node fza through the access transistor 622. Similarly, a node fzFb of the half interlock latch circuit 600 may be electrically connected to the access transistor 624. Accordingly, responsive to an assertion of node fuseLoad, the node EfusedataF may be electrically connected to the node fzFb through the access transistor 624.

The half interlock latch circuit 600 also includes five (5) PMOS transistors (i.e., PMOS transistor 602, PMOS transistor 604, PMOS transistor 606, PMOS transistor 608, and PMOS transistor 610) and five (5) NMOS transistors (NMOS transistor 612, NMOS transistor 614, NMOS transistor 616, NMOS transistor 618, and NMOS transistor 620). A source of PMOS transistor 602 may be electrically connected to a high voltage potential power source node VDD. A gate of the PMOS transistor 602 may be electrically connected to the node fuseLoad of the half interlock latch circuit 600. Accordingly, a drain of the PMOS transistor 602 may be electrically connected to VDD responsive to an assertion of fuseLoad (an assertion for a PMOS transistor gate such as that of PMOS transistor 602 may be a logic level low voltage potential, or "L" or "0"), which is the same node used to trigger the access transistor 622 and access transistor 624 to enable access to the half interlock latch circuit 600. Similarly, a source of NMOS transistor 620 is electrically connected to a low voltage potential power source node VSS. A gate of the NMOS transistor 620 may be electrically connected to a node fuseLoadF, which is configured to carry a voltage potential that is complementary to that of the node fuseLoad. Accordingly, a drain of the NMOS transistor 620 may be electrically connected to VSS responsive to an assertion of fuseLoadF (an assertion for an NMOS transistor gate such as that of NMOS transistor 620 may be a logic level high voltage potential).

With complementary signals (signals on nodes fuseLoad and fuseLoadF) applied to gates of transistors (PMOS transistor 602 and NMOS transistor 620, respectively) connected to VDD and VSS, the PMOS transistor 602 and the NMOS transistor 620 electrically isolate the half interlock latch circuit 600 from VDD and VSS while the half interlock latch circuit 600 is being accessed (i.e., while node fuseLoad is asserted to cause access transistor 622 and access transistor 624 to conduct). Also, the PMOS transistor 602 and the NMOS transistor 620 electrically connect the rest of the half interlock latch circuit 400 to VDD and VSS while the half interlock latch circuit 600 is not being accessed (i.e., while node fuseLoad is deasserted to prevent access transistor 622 and access transistor 624 from conducting). As a result, during a read operation of a fuse electrically connected to Efusedata, the half interlock latch circuit 600 may be driven by electrical signals on nodes Efusedata and EfusedataF rather than by power rail voltage potentials on VSS and VDD. Accordingly, a bit of data may be stored by the half interlock latch circuit 600 responsive to voltage potentials applied to Efusedata and EfusedataF. After the half interlock latch circuit 600 is no longer being accessed, the half interlock latch circuit 600 is electrically connected to VDD and VSS through PMOS transistor 602 and NMOS transistor 620, and the half interlock latch circuit 400 may be driven by power voltage potentials provided to VDD and VSS. In this configuration the drain of PMOS transistor 602 is electrically connected to VDD and the drain of NMOS transistor 620 is electrically connected to VSS.

The half interlock latch circuit 600 includes four (4) pairs of transistors (pair of transistors 626, pair of transistors 628, pair of transistors 630, and pair of transistors 632). Pair of transistors 626 includes PMOS transistor 608 and PMOS transistor 604 electrically connected in series. The pair of transistors 626 is electrically connected between a drain of PMOS transistor 602 and node fzFa of the half interlock latch circuit 600. Gates of the pair of transistors 626 are electrically connected to node fza of the half interlock latch circuit 600. Accordingly, responsive to an assertion (i.e., a logic level low voltage potential) of the gates (node fza) of the pair of transistors 626, the pair of transistors 626 is configured to electrically connect the node fzFa to the drain of PMOS transistor 602. Also, responsive to a deassertion (i.e., a logic level high voltage potential) of the gates (node fza) of the pair of transistors 626, the pair of transistors 626 is configured to electrically isolate the node fzFa from the drain of PMOS transistor 602.

Pair of transistors 628 includes PMOS transistor 610 and PMOS transistor 606 electrically connected in series. The pair of transistors 628 is electrically connected between a drain of PMOS transistor 602 and node fzb of the half interlock latch circuit 600. Gates of the pair of transistors 628 are electrically connected to node fzFb of the half interlock latch circuit 600. Accordingly, responsive to an assertion (i.e., a logic level low voltage potential) of the gates (node fzFb) of the pair of transistors 628, the pair of transistors 628 is configured to electrically connect the node fzb to the drain of PMOS transistor 602. Also, responsive to a deassertion (i.e., a logic level high voltage potential) of the gates (node fzFb) of the pair of transistors 628, the pair of transistors 628 is configured to electrically isolate the node fzb from the drain of PMOS transistor 602.

Pair of transistors 630 includes NMOS transistor 612 and NMOS transistor 614 electrically connected in series. The pair of transistors 630 is electrically connected between a drain of NMOS transistor 620 and node fza of the half interlock latch circuit 600. Gates of the pair of transistors 630 are electrically connected to node fzFa of the half interlock latch circuit 600. Accordingly, responsive to an assertion (i.e., a logic level high voltage potential) of the gates (node fzFa) of the pair of transistors 630, the pair of transistors 630 is configured to electrically connect the node fza to the drain of NMOS transistor 620. Also, responsive to a deassertion (i.e., a logic level low voltage potential) of the gates (node fzFa) of the pair of transistors 630, the pair of transistors 630 is configured to electrically isolate the node fza from the drain of NMOS transistor 620.

Pair of transistors 632 includes NMOS transistor 616 and NMOS transistor 618 electrically connected in series. The pair of transistors 632 is electrically connected between a drain of NMOS transistor 620 and node fzFb of the half interlock latch circuit 600. Gates of the pair of transistors 632 are electrically connected to node fzb of the half interlock latch circuit 600. Accordingly, responsive to an assertion (i.e., a logic level high voltage potential) of the gates (node fzb) of the pair of transistors 632, the pair of transistors 632 is configured to electrically connect the node fzFb to the drain of NMOS transistor 620. Also, responsive to a deassertion (i.e., a logic level low voltage potential) of the gates (node fzb) of the pair of transistors 632, the pair of transistors 632 is configured to electrically isolate the node fzFb from the drain of NMOS transistor 620.

While the half interlock latch circuit 600 is being accessed (i.e., a logic level high voltage potential is applied to node fuseLoad and a logic level low voltage potential is applied to node fuseLoadF), a bit of data may be read from a fuse electrically connected to Efusedata responsive to electrical biases applied to the fuse. In response, if a logic level high voltage potential is applied to node Efusedata and a logic level low voltage potential is applied to node EfusedataF, nodes fza and fzb will take on the logic level high voltage potential and nodes fzFa and fzFb will take on the logic level low voltage potential. If, however, a logic level low voltage potential is applied to node Efusedata and a logic level high voltage potential is applied to node EfusedataF, nodes fza and fzb will take on the logic level low voltage potential and nodes fzFa and fzFb will take on the logic level high voltage potential.

While the half interlock latch circuit 600 is not being accessed (i.e., a logic level low voltage potential is applied to node fuseLoad and a logic level high voltage potential is applied to node fuseLoadF), the bit of data read from the fuse is stored by the half interlock latch circuit 600. In this state (not being accessed), the half interlock latch circuit 600 is electrically connected to VDD and VSS, which drive the half interlock latch circuit 600 to maintain nodes fza, fzb, fzFa, and fzFb at the logic levels taken on while the half interlock latch circuit 600 was last accessed. Accordingly, the half interlock latch circuit 600 is configured to store the bit read from the fuse so long as VDD and VSS are powered by high and low, respectively, voltage potential power supplies.

It is also noted that both pairs of transistors (pair of transistors 626 and pair of transistors 628) that are electrically connected to VDD through PMOS transistor 602 include PMOS transistors. The gates of the pair of transistors 626, however, are electrically connected to node fza, which carries a complementary logic level voltage potential to that of node fzFb, which is electrically connected to the gates of pair of transistors 628. Accordingly, assuming proper function of the half interlock latch circuit 600, pair of transistors 626 should be in a nonconducting state when pair of transistors 628 are in a conducting state. Likewise, pair of transistors 628 should be in a nonconducting state when pair of transistors 626 are in a conducting state. Similarly, both pairs of transistors (pair of transistors 630 and pair of transistors 632) that are electrically connected to VSS through NMOS transistor 620 include NMOS transistors. The gates of the pair of transistors 630, however, are electrically connected to node fzFa, which carries a complementary logic level voltage potential to that of node fzb, which is electrically connected to the gates of pair of transistors 632. Accordingly, assuming proper function of the half interlock latch circuit 600, pair of transistors 630 should be in a nonconducting state when pair of transistors 632 is in a conducting state. Likewise, pair of transistors 632 should be in a nonconducting state when pair of transistors 630 is in a conducting state.

Moreover, pair of transistors 626 and pair of transistors 630 should both be in a nonconducting state when pair of transistors 628 and pair of transistors 632 are in a conducting state. Also, pair of transistors 628 and pair of transistors 632 should both be in a nonconducting state when pair of transistors 626 and pair of transistors 630 are in a conducting state. Accordingly, a first half 634 of half interlock latch circuit 600 including pair of transistors 626 and pair of transistors 630 is configured to operate in a driven state while a second half 636 of the half interlock latch circuit 600 including pair of transistors 628 and pair of transistors 632 is operating in a high impedance (HiZ) state. Also, the second half 636 of half interlock latch circuit 600 is configured to operate in a driven state while the first half 634 of half interlock latch circuit 600 is operating in a HiZ state.

Nodes fza and fzFa are part of the first half 634 of the half interlock latch circuit 600 and nodes fzb and fzFb are part of the second half 636 of the half interlock latch circuit 600. If current is injected on any of nodes fza, fzb, fzFa, or fzFb (e.g., due to particle strikes) while in a driven half of the half interlock latch circuit 600, the opposite half of the half interlock latch circuit 600 in the HiZ half of the half interlock latch circuit 600 may not flip because the HiZ half of the half interlock latch circuit 600 is electrically isolated from the power supply nodes VDD and VSS. As a result, at least one pair of transistors (e.g., pair of transistors 626, pair of transistors 628, pair of transistors 630, or pair of transistors 632) must switch on before the HiZ side of the half interlock latch circuit 600 can flip responsive to the injected current, making it difficult for the injected current to flip the HiZ side of the half interlock latch circuit 600. Since the HiZ side of half interlock latch circuit 600 does not readily flip, the injected current may dissipate and the nodes (fza, fzb, fzFa, and fzFb) may return to their previous voltage potentials without flipping the bit stored by the half interlock latch circuit 600. Also, since the half interlock latch circuit 600 is resistant to flipping a bit stored thereon, the nodes of the half interlock latch circuit 600 may behave similarly to the half interlock latch circuit 400 responsive to injected currents (e.g., responsive to particle strikes on transistors of the half interlock latch circuit 600). Accordingly, the voltage potentials on the nodes of half interlock latch circuit 600 may behave similarly to that shown for the half interlock latch circuit 400 of FIG. 4 by the signal timing diagram 500 of FIG. 5.

Upon power up (e.g., application of power voltage potentials to VDD and VSS), by default nodes Fza and Fzb may be latched to a logic level high voltage potential and nodes FzFa and FzFb may be clamped to a logic level low voltage potential. The half interlock latch circuit 600 may not manifest any voltage potential or electrical current spikes at its nodes during power up. Also, nodes of the half interlock latch circuit 600 may not manifest any spikes (e.g., voltage potential or current spikes) upon transitions between logic levels of the nodes (e.g., transitions from a logic level high voltage potential at nodes fza and fzb to a logic level low voltage potential, and from a logic level low voltage potential to a logic level high voltage potential).

It is noted that since nodes fza and fzb are electrically connected to each other and nodes fzFa and fzFb are electrically connected to each other in the half interlock latch circuit 600, a first node including nodes fza and fzb and a second node including nodes fzFa and fzFb may be referred to herein.

In addition to achieving similar advantages as the half interlock latch circuit 400, the half interlock latch circuit 600 does not suffer from the bias defect mentioned with respect to the half interlock latch circuit 400. This is because nodes fza and fzb are directly electrically connected to each other and nodes fzFa and fzFb are directly electrically connected to each other in contrast to analogous nodes of the half interlock latch circuit 400 being connected through the pair of transistors 428 and the pair of transistors 426, respectively. Accordingly, in the half interlock latch circuit 600, the drivability between driven and HiZ sides is equal since there are no transistors between connected nodes (between nodes fza and fzb, and between nodes fzFa and FzFb) to resist against driving of nodes in a HiZ side of the half interlock latch circuit 600.

Figure 7:
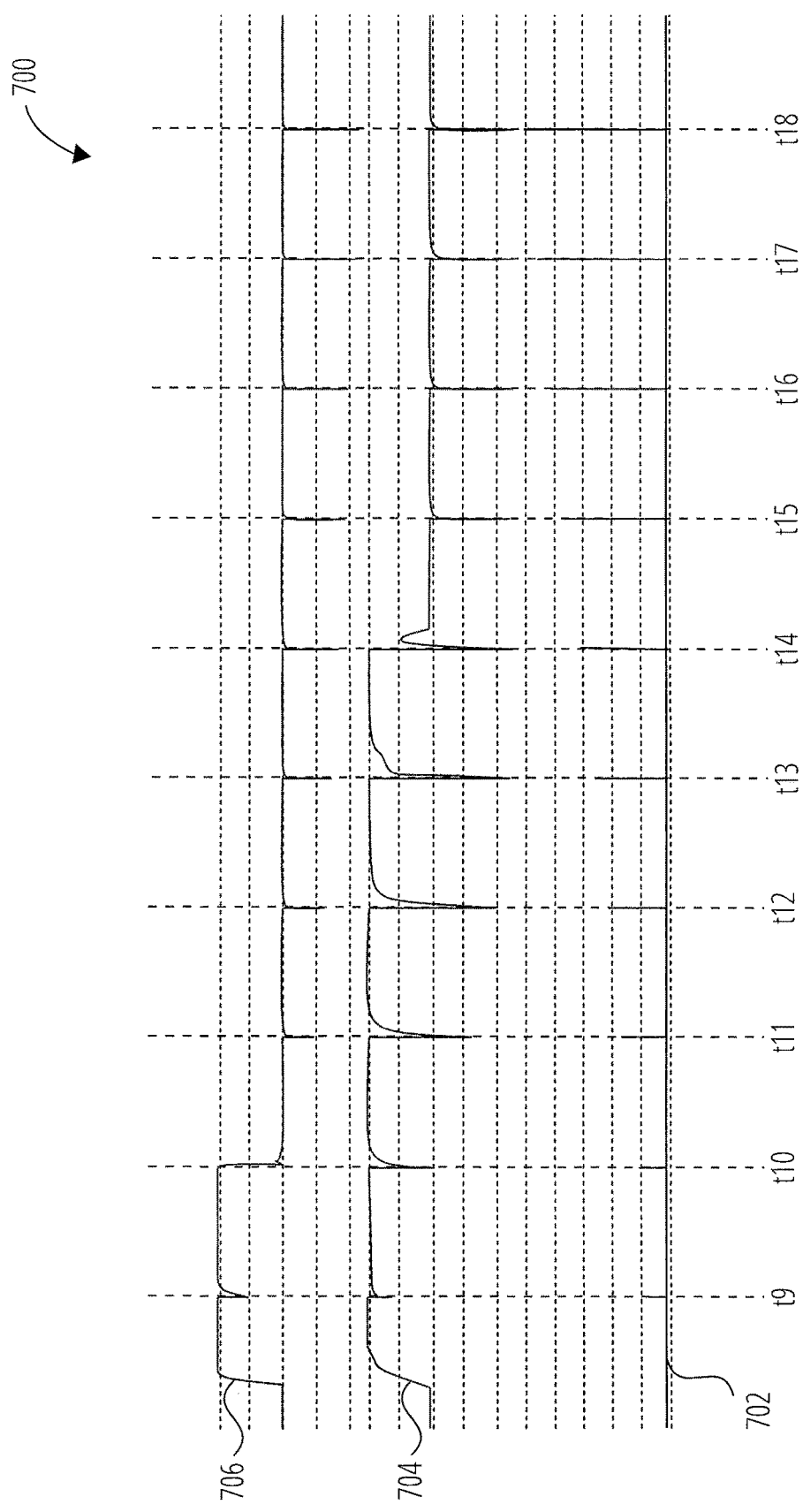
FIG. 7 is a signal timing diagram illustrating responses of the SRAM latch circuit of FIG. 1 and the half interlock latch circuit of FIG. 6 to varying levels of injected current introduced thereto.

FIG. 7 is a signal timing diagram 700 illustrating responses of the SRAM latch circuit 100 of FIG. 1 and the half interlock latch circuit 600 of FIG. 6 to varying levels of injected current introduced thereto. The signal timing diagram 700 includes a plot of an injected current 702 (shown in hundreds of micro amps of electrical current plotted against time with the time progressing left to right from earlier to later) injected into a node of the SRAM latch circuit 100 and a node of the half interlock latch circuit 600.

The signal timing diagram 700 also includes a plot of an SRAM latch circuit response 706 including a response of a voltage potential (measured in increments of a half a volt) over time at the injected node of the SRAM latch circuit 100 to the injected current 702. For example, the injected current 702 may be injected on a drain of any one of PMOS transistor 102, PMOS transistor 104, NMOS transistor 106, and NMOS transistor 108 of the SRAM latch circuit 100 of FIG. 1. The signal timing diagram 700 illustrates the SRAM latch circuit response 706 initially starting at substantially zero volts (0 V) and powering up to substantially one volt (1 V), which may be associated with a logic level high voltage potential, prior to time t9.

The signal timing diagram 700 further includes a plot of a half interlock latch circuit response 704 including a response of a voltage potential (measured in increments of a half a volt) over time at the injected node of the half interlock latch circuit 600 to the injected current 702. For example, the injected current 702 may be injected on any one of nodes fza, fzb, fzFa, or fzFb of the half interlock latch circuit 600 of FIG. 6 (the half interlock latch circuit response 704 of FIG. 7 is taken at node fzFa). The signal timing diagram 700 illustrates the half interlock latch circuit response 704 initially starting at substantially zero volts (0 V) and powering up to substantially one volt (1 V), which may be associated with a logic level high voltage potential, prior to time t9.

The injected current 702 includes a series of pulses occurring at times t9-t18. A magnitude of the first pulse at time t9 is substantially 50 micro amps (uA). Each subsequent pulse (at times t10-t18) on injected current 702 has a magnitude substantially 50 uA higher than that of the preceding pulse. Accordingly, a pulse at time t10 has a magnitude of substantially 100 uA, a pulse at time t11 has a magnitude of substantially 150 uA, and so on until the pulse at time t18 has a magnitude of substantially 500 uA.

As illustrated by the signal timing diagram 700, at time t9 the first pulse on injected current 702 is insufficient to flip the SRAM latch circuit response 706 and the half interlock latch circuit response 704 from the logic level high voltage potential (substantially 1 V, without limitation) to a logic level low voltage potential (substantially 0 V, without limitation). Accordingly, both the SRAM latch circuit 100 of FIG. 1 and the half interlock latch circuit 600 of FIG. 6 may be resistant to soft errors when 50 uA or less are injected on their respective nodes. Proceeding, however, to time t10, an injected current spike of substantially 100 uA is sufficient to flip the bit stored by the SRAM latch circuit 100 of FIG. 1. In other words, the SRAM latch circuit response 706 transitions from the logic level high voltage potential (e.g., substantially 1 V) to the logic level low voltage potential (e.g., 0 V) responsive to the pulse on injected current 702 at time t10. In contrast, the bit stored by the half interlock latch circuit 600 of FIG. 6 does not flip responsive to the 100 uA injected current at time t10, and the half interlock latch circuit response 704 remains at the logic level high voltage potential after time t10. Accordingly, the half interlock latch circuit 600, but not the SRAM latch circuit 100, may be resistant to soft errors when 100 uA or less are inject on its nodes.

The resistance of the half interlock latch circuit 600 may be such that pulses on the injected current 702 of substantially 150 uA, 200 uA, and 250 uA at times t11, t12, and t13, respectively, are all insufficient to cause the half interlock latch circuit 600 of FIG. 6 to flip a bit stored thereon. In other words, the half interlock latch circuit response 704 remains at the logic level high voltage potential responsive to the pulses at times t11, t12, and t13. At time t14, however, a pulse of substantially 300 uA on the injected current 702 may cause the bit stored by the half interlock latch circuit 600 to flip. In other words, the half interlock latch circuit response 704 may transition from the logic level high voltage potential to the logic level low voltage potential responsive to the pulse of substantially 300 uA at time t14.

As compared to a bit-flipping trigger current of the SRAM latch circuit 100 of substantially 100 uA injected current, a bit-flipping trigger current of the half interlock latch circuit 600 may be substantially 300 uA. Accordingly, the bit-flipping trigger current of the half interlock latch circuit 600 is substantially triple (i.e., substantially 3 times) that of the SRAM latch circuit 100. Since charge is proportional to current, a critical charge (Qcrit) of the half interlock latch circuit 600 may be substantially triple that of the SRAM latch circuit 100.

It should be noted that, although the half interlock latch circuit response 704 is taken specifically from the half interlock latch circuit 600 of FIG. 6, a half interlock latch circuit response of the half interlock latch circuit 400 of FIG. 4 may perform similarly to the half interlock latch circuit response 704. Accordingly, the Qcrit of the half interlock latch circuit 400 may also be substantially triple that of the SRAM latch circuit 100.

Figure 8:
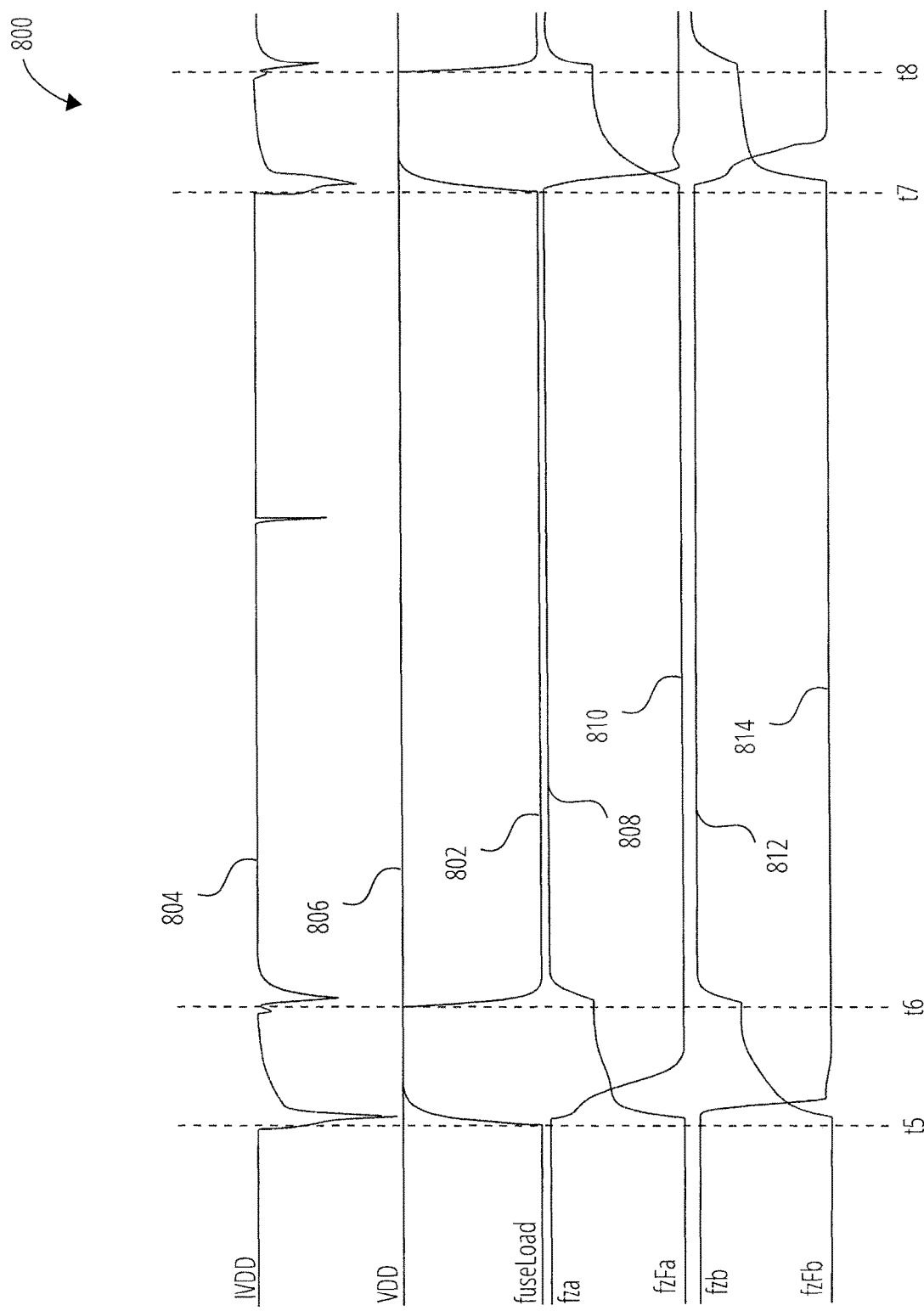
FIG. 8 is a signal timing diagram illustrating operation of the half interlock latch circuit of FIG. 6, according to some embodiments.

FIG. 8 is a signal timing diagram 800 of voltage potentials at various nodes of the half interlock latch circuit 600 of FIG. 6. Referring to FIG. 6 and FIG. 8 together, the signal timing diagram 800 includes an access voltage potential 802 at node fuseLoad, a power supply current 804 at power supply node VDD, a power supply voltage potential 806 at node VDD (illustrated as constantly at a logic level high voltage potential such as 1.1 volts in the signal timing diagram 800), a fza voltage potential 810 at node fza, a fzFa voltage potential 808 at node fzFa, a fzb voltage potential 814 at node fzb, and a fzFb voltage potential 812 at node fzFb, each plotted over time (with time increasing from left to right in the signal timing diagram 800). The signals illustrated in FIG. 8 may be simulated signals to show behavior of the half interlock latch circuit 600 responsive to both a default state and a blown state of a fuse connected to node Efusedata.

At time t5, access voltage potential 802 is asserted (e.g., set at a logic level high), electrically connecting node fza to node Efusedata (set at a logic level low voltage potential) and node fzFb to node EfusedataF (set to a logic level high voltage potential). Accordingly, following time t5, the fzFa voltage potential 808 and fzFb voltage potential 812 are driven to a logic level high voltage potential (e.g., about 1.1 volts higher than a logic level low voltage potential) and the fza voltage potential 810 and the fzb voltage potential 814 are driven to a logic level low voltage potential. A negative spike in the power supply current 804 is shown responsive to this driving of the nodes. Following a deassertion of the access voltage potential 802 at time t6, which electrically isolates node fza and node fzFb from node Efusedata and node EfusedataF, respectively, the half interlock latch circuit signal timing diagram 700 continues to hold fza voltage potential 810 and fzb voltage potential 814 at the logic level low voltage potential and fzFa voltage potential 808 and fzFb voltage potential 812 at the logic level high voltage potential. The deassertion of the access voltage potential 802 at time t6 may be accompanies by another negative spike in the power supply current 804.

Following time t6, a state (e.g., a default state or a blown state) of the fuse associated with the half interlock latch circuit 600 may be determined responsive to any one or more of the fza voltage potential 810, the fzb voltage potential 814, the fzFa voltage potential 808, and the fzFb voltage potential 812 stored by the half interlock latch circuit 600.

At time t7, access voltage potential 802 is asserted (e.g., set at a logic level high), electrically connecting node fza and node fzFb to node Efusedata (now set at a logic level high voltage potential) and node EfusedataF (now set at a logic level high voltage potential), respectively. Accordingly, fza voltage potential 810 and fzb voltage potential 814 are driven to a logic level high voltage potential and fzFa voltage potential 808 and fzFb voltage potential 812 are driven to a logic level low voltage potential. The half interlock latch circuit 600 will continue to hold fza voltage potential 810 and fzb voltage potential 814 at the logic level high voltage potential and fzFa voltage potential 808 and fzFb voltage potential 812 at the logic level low voltage potential following a deassertion (e.g., a transition from the logic level high to a logic level low) of the access voltage potential 802 at time t8. Accordingly, a state (e.g., a default state or a blown state) of the fuse associated with the half interlock latch circuit 600 may be determined responsive to any one or more of the fza voltage potential 810, the fzb voltage potential 814, the fzFa voltage potential 808, and the fzFb voltage potential 812 stored by the half interlock latch circuit 600.

FIG. 8 illustrates that the half interlock latch circuit 600 may properly invert voltage potentials at each of nodes fza, fzb, fzFa, and fzFb from a logic level high voltage potential to a logic level low voltage potential, and from a logic level low voltage potential to a logic level high voltage potential. It is noted that the half interlock latch circuit 400 of FIG. 4 may show similar voltage potential behavior at its nodes to those illustrated in the signal timing diagram 800 of FIG. 8 for the half interlock latch circuit 600 of FIG. 6.

Figure 9:
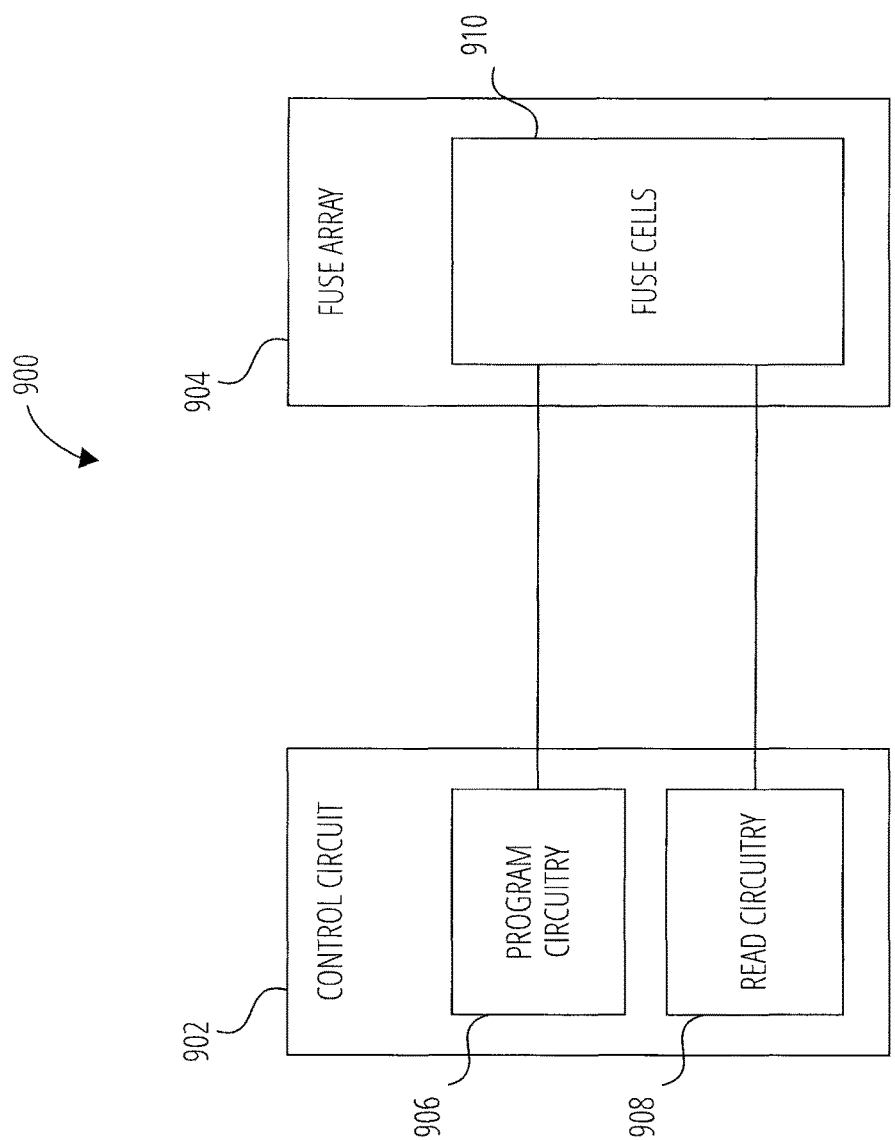
FIG. 9 is a block diagram of a fuse circuit, according to some embodiments.

FIG. 9 is a block diagram of a fuse circuit 900, according to some embodiments. The fuse circuit 900 includes a control circuit 902 and a fuse array 904. The fuse array 904 includes a plurality of fuse cells 910. Each one of the plurality of fuse cells 910 may include a fuse electrically connected to a latch circuit (e.g., the SRAM latch circuit 100 of FIG. 1, the half interlock latch circuit 400 of FIG. 4, the half interlock latch circuit 600 of FIG. 6). The control circuit 902 includes program circuitry 906 and read circuitry 908 operably coupled to the plurality of fuse cells 910. The program circuitry 906 is configured to program the plurality of fuse cells 910. For example, the program circuitry 906 is configured to apply, to the plurality of fuse cells 910, appropriate electrical biases (e.g., bias currents and/or bias voltage potentials) to fuses in the plurality of fuse cells 910 to blow selected fuses of the plurality of fuse cells 910. Also, the read circuitry 908 is configured to read the fuses in the plurality of fuse cells 910. For example, the read circuitry 908 may be configured to apply appropriate electrical biases to the fuses of the plurality of fuse cells 910 to enable latch circuits of the plurality of fuse cells 910 to latch bits stored by the fuses. Based on the bits latched by the latch circuits, the read circuitry 908 may determine whether selected fuses of the plurality of fuse cells 910 have been blown or not.

Figure 10:
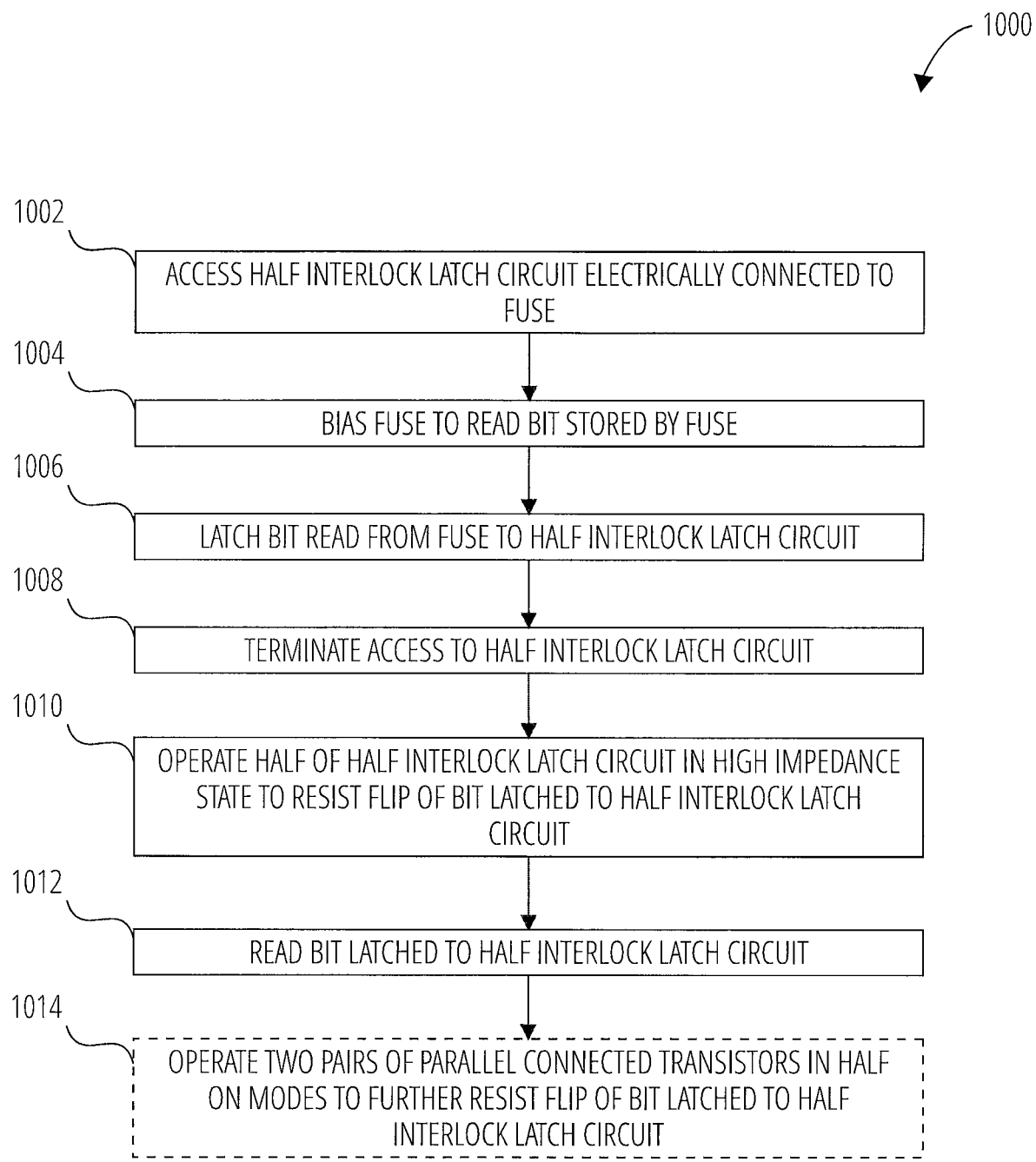
FIG. 10 is a flowchart illustrating a method of operating a half interlock latch circuit, according to some embodiments.

FIG. 10 is a flowchart illustrating a method 1000 of operating a half interlock latch circuit (e.g., the half interlock latch circuit 400 of FIG. 4, the half interlock latch circuit 600 of FIG. 6), according to some embodiments. In operation 1002, method 1000 includes accessing a half interlock latch circuit electrically connected to a fuse (e.g., using read circuitry 908 of FIG. 9). For example, accessing a half interlock latch circuit may include asserting a voltage potential of gates of access transistors of the half interlock latch circuit to cause the access transistors to conduct. In some embodiments, accessing a half interlock latch circuit includes electrically isolating the half interlock latch circuit from power nodes of the half interlock latch circuit responsive to accessing the half interlock latch circuit.

In operation 1004, method 1000 includes biasing (e.g., using read circuitry 908 of FIG. 9) the fuse electrically connected to the half interlock latch circuit to read a bit stored by the fuse. In operation 1006, method 1000 includes latching the bit read from the fuse to the half interlock latch circuit.

In operation 1008, method 1000 includes terminating access to the half interlock latch circuit. By way of non-limiting example, terminating access to the half interlock latch circuit includes electrically connecting the half interlock latch circuit to the power nodes of the half interlock latch circuit responsive to the termination of access to the half interlock latch circuit.

In operation 1010, method 1000 includes operating half of the half interlock latch circuit in a high impedance state to resist a flip of the bit latched to the half interlock latch circuit. For example, a first half of the half interlock latch circuit may operate in a high impedance state responsive to a second half of the half interlock latch circuit operating in a driven state. Also, the second half of the half interlock latch circuit may operate in a high impedance state responsive to the first half of the half interlock latch circuit operating in a driven state.

In operation 1012, method 1000 includes reading (e.g., using read circuitry 908 of FIG. 9) the bit latched to the half interlock latch circuit. In some embodiments reading the bit latched to the half interlock latch circuit includes operation 1002, accessing the half interlock latch circuit, and sensing voltage potentials on nodes of the half interlock latch circuit to determine a value of the bit latched to the half interlock latch circuit.

In operation 1014, method 1000 optionally includes (e.g., as in the case of the half interlock latch circuit 400 of FIG. 4) operating two pairs of parallel connected transistors in half on modes to further resist the flip of the bit latched to the half interlock latch circuit. In some embodiments, method 1000 may not include operation 1014.

Figure 11:
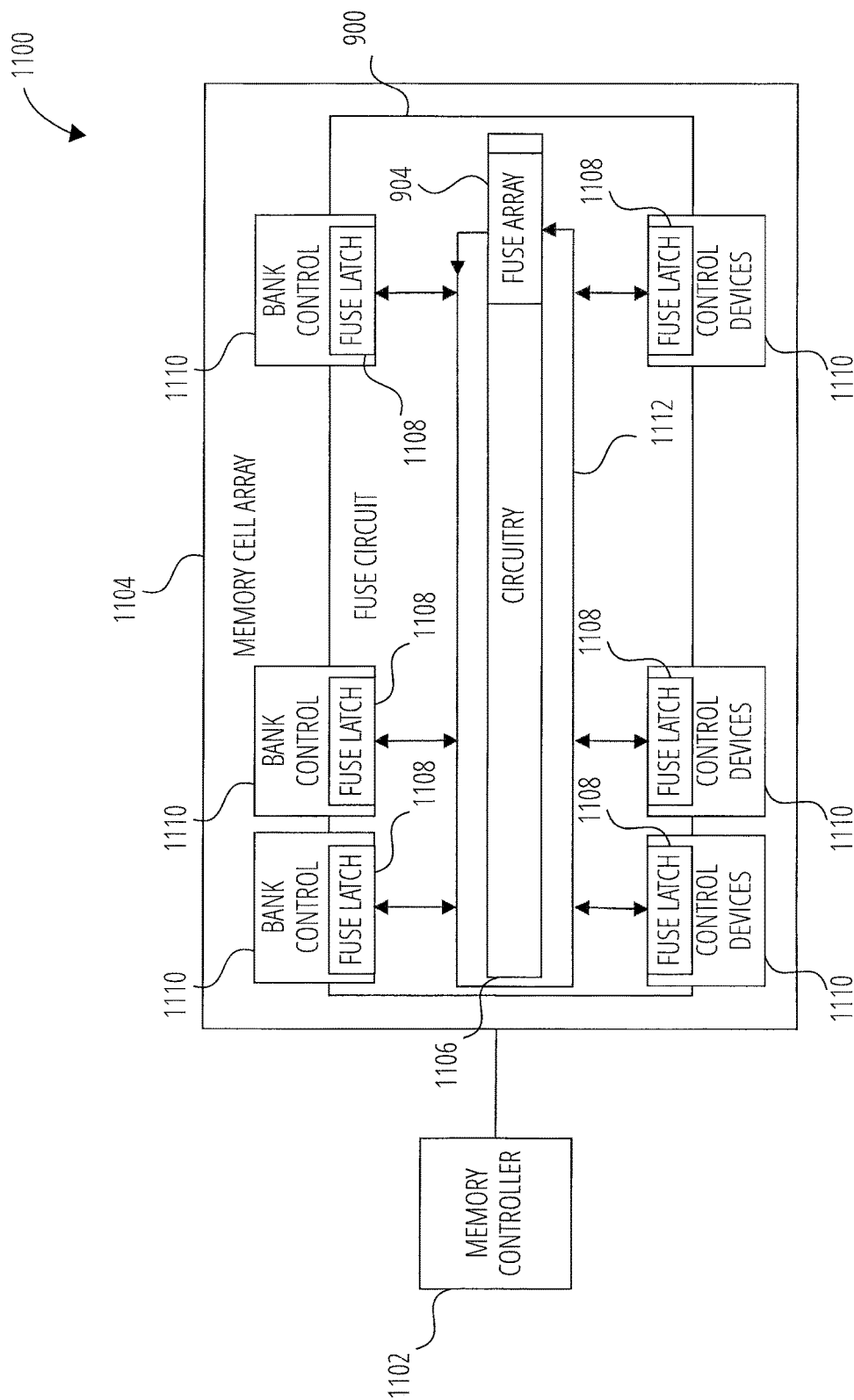
FIG. 11 is a block diagram of a memory device, according to some embodiments.

FIG. 11 is a block diagram of a memory device 1100, according to some embodiments. The memory device 1100 includes the fuse circuit 900 of FIG. 9, a memory controller 1102, and a memory cell array 1104. The memory controller 1102 is operably coupled to the fuse circuit 900 and the memory cell array 1104. The memory controller 1102 is configured to control the fuse circuit 900 and the memory cell array 1104.

The fuse circuit 900 includes circuitry 1106 including the fuse array 904, PADs, command decoders, internal power supplies, test mode control schematics, etc. The fuse circuit 900 also includes fuse latches 1108 electrically connected to fuses of the fuse array 904 via one or more fuse buses 1112. The fuse latches 1108 may each include latch circuits (e.g., SRAM latch circuit 100 of FIG. 1, half interlock latch circuit 400 of FIG. 4, half interlock latch circuit 600 of FIG. 6). Accordingly, the fuse circuit 900, and by extension the memory device 1100, may benefit from the features of the latch circuits discussed above.

Bits stored in each of the fuses of the fuse array 904 may be transferred to the corresponding fuse latches 1108 via the one or more fuse buses 1112 in a power up sequence of the memory device 1100. The one or more fuse buses 1112 may be configured to operate according to a serial transfer scheme to reduce the number of conductors in the one or more fuse buses 1112. Bank control devices 1110 may be configured to control the fuse circuit 900.

Fuse circuits such as the fuse circuit 900 may have various uses in a memory device such as the memory device 1100. The fuse circuit 900 may be used to permanently store information that is useful in operating the memory device 1100. For example, the fuse circuit 900 may be used to store information indicating memory cells in the memory cell array 1104 that need to have repair or maintenance performed thereon. As another example, the fuse circuit 900 may be used to store information indicating output offsets of input buffers (not shown) of the memory device 1100 to enable compensation for the offsets. The fuse circuit 900 may be used for various other purposes as will be apparent to those of ordinary skill in the art.

Figure 12:
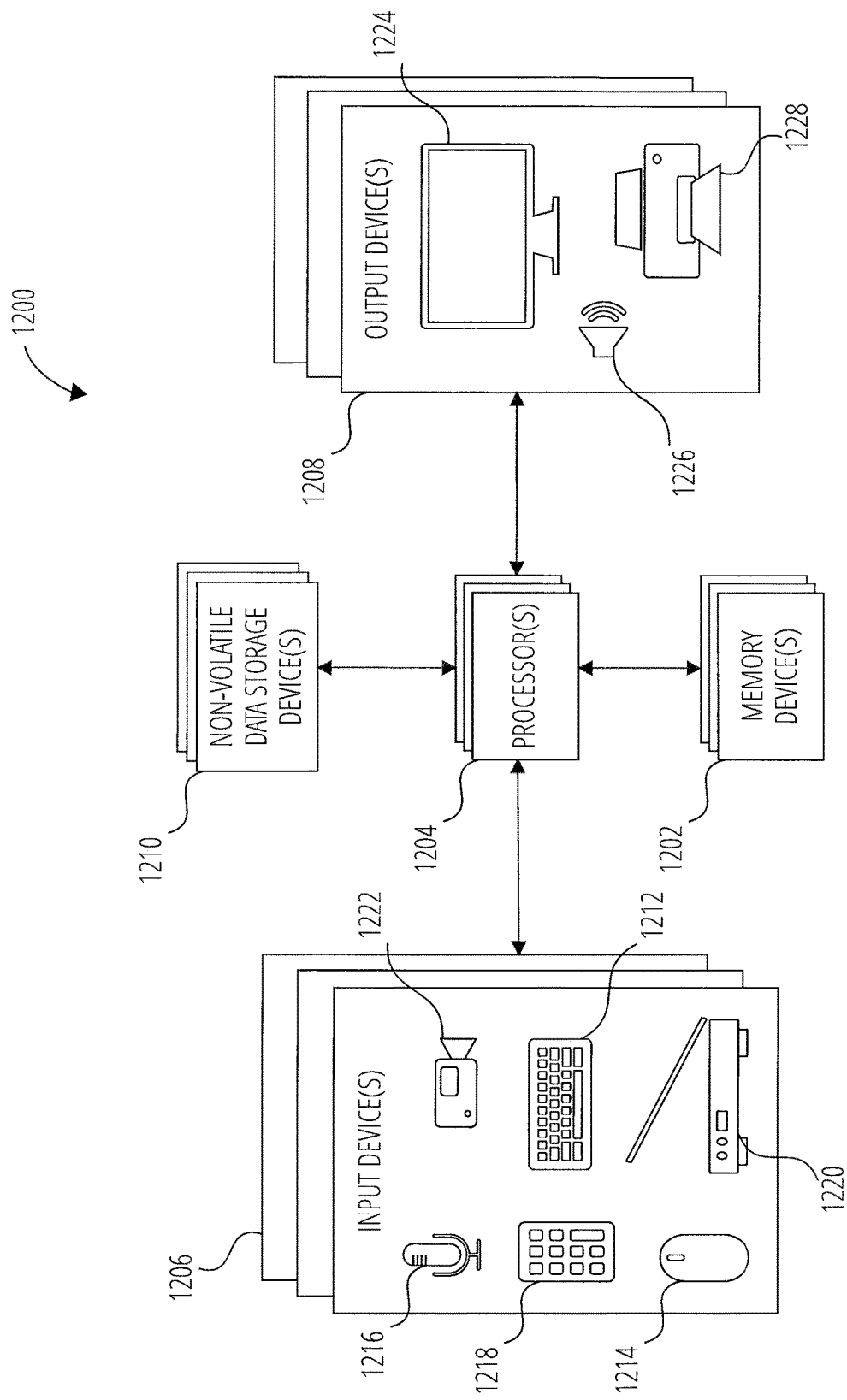
FIG. 12 is a block diagram of a computing system, according to some embodiments.

FIG. 12 is a block diagram of a computing system 1200, according to some embodiments. The computing system 1200 includes one or more processors (processors 1204) operably coupled to one or more memory devices (memory devices 1202), one or more non-volatile data storage devices (non-volatile data storage devices 1210), one or more input devices (input devices 1206), and one or more output devices (output devices 1208). In some embodiments the computing system 1200 includes a personal computer (PC) such as a desktop computer, a laptop computer, a tablet computer, a mobile computer (e.g., a smartphone, a personal digital assistant (PDA), etc.), a network server, or other computer device.

In some embodiments the processors 1204 may include a central processing unit (CPU) or other processor configured to control the computing system 1200. In some embodiments the memory devices 1202 include random access memory (RAM), such as volatile data storage (e.g., dynamic RAM (DRAM) static RAM (SRAM), etc.). In some embodiments the non-volatile data storage devices 1210 include a hard drive, a solid state drive, Flash memory, erasable programmable read only memory (EPROM), other non-volatile data storage devices, or any combination thereof. In some embodiments the input devices 1206 include a keyboard 1212, a pointing device 1214 (e.g., a mouse, a track pad, etc.), a microphone 1216, a keypad 1218, a scanner 1220, a camera 1222, other input devices, or any combination thereof. In some embodiments the output devices 1208 include an electronic display 1224, a speaker 1226, a printer 1228, other output devices, or any combination thereof.

In some embodiments the memory devices 1202 may include the memory device 1100 of FIG. 11. In some embodiments, at least one of the processors 1204, the memory devices 1202, the non-volatile data storage devices 1210, the input devices 1206, and the output devices 1208 include the SRAM latch circuit 100 of FIG. 1, the half interlock latch circuit 400 of FIG. 4, or the half interlock latch circuit 600 of FIG. 6.

In some embodiments an apparatus comprises a half interlock latch circuit including a first half and a second half of the half interlock latch circuit. The first half of the half interlock latch circuit includes a first plurality of transistors of the half interlock latch circuit. The second half of the half interlock latch circuit includes a second plurality of transistors of the half interlock latch circuit. The first half of the half interlock latch circuit is configured to operate in a high impedance state responsive to operation of the second half of the half interlock latch circuit in a driven state. The second half of the half interlock latch circuit is configured to operate in a high impedance state responsive to operation of the first half of the half interlock latch circuit in a driven state.

In some embodiments a method of operating a half interlock latch circuit includes accessing a half interlock latch circuit electrically connected to a fuse, biasing the fuse to read a bit stored by the fuse, latching the bit read from the fuse to the half interlock latch circuit, and terminating access to the half interlock latch circuit. The method also includes operating half of the half interlock latch circuit in a high impedance state to resist a flip of the bit latched to the half interlock latch circuit, and reading the bit latched to the half interlock latch circuit.

In some embodiments, a computing system includes a half interlock latch circuit including. The half interlock latch circuit includes a first node, a second node, a pair of first N-type metal oxide semiconductor (NMOS) transistors, a pair of first P-type metal oxide semiconductor (PMOS) transistors, a pair of second NMOS transistors, and a pair of second PMOS transistors. The pair of first NMOS transistors is electrically connected in series. The pair of first NMOS transistors is electrically connected between the first node and a low voltage potential power supply node. The pair of first PMOS transistors is electrically connected in series. The pair of first PMOS transistors is electrically connected between the second node and a high voltage potential power supply node. The pair of second NMOS transistors is electrically connected in series. The pair of second NMOS transistors is electrically connected between the low voltage potential power supply node and the second node. The pair of second PMOS transistors is electrically connected in series. The pair of second PMOS transistors is electrically connected between the high voltage potential power supply node and the first node.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
    a half interlock latch circuit including:
        a first half of the half interlock latch circuit including a first plurality of transistors of the half interlock latch circuit; and
        a second half of the half interlock latch circuit including a second plurality of transistors of the half interlock latch circuit, the first half of the half interlock latch circuit configured to operate in a high impedance state responsive to operation of the second half of the half interlock latch circuit in a driven state, the second half of the half interlock latch circuit configured to operate in a high impedance state responsive to operation of the first half of the half interlock latch circuit in a driven state.

2. The apparatus of claim 1, wherein the first plurality of transistors of the first half of the half interlock latch circuit includes four transistors and the second plurality of transistors of the second half of the half interlock latch circuit includes four transistors.

3. The apparatus of claim 1, wherein:
    the first half of the half interlock latch circuit includes a pair of first N-type metal oxide semiconductor (NMOS) transistors electrically connected in series and a pair of first P-type metal oxide semiconductor (PMOS) transistors electrically connected in series; and
    the second half of the half interlock latch circuit includes a pair of second NMOS transistors electrically connected in series and a pair of second PMOS transistors electrically connected in series.

4. The apparatus of claim 3, wherein the half interlock latch circuit further comprises:
    a PMOS transistor electrically connected to a high voltage potential power node; and
    an NMOS transistor electrically connected to a low voltage potential power node.

5. The apparatus of claim 4, wherein the half interlock latch circuit further includes a first node and a second node, the half interlock latch circuit configured to drive the first node and the second node to complementary logic level voltage potentials to latch a bit.

6. The apparatus of claim 5, wherein:
    the pair of first NMOS transistors is electrically connected between the NMOS transistor and the first node;
    the pair of first PMOS transistors is electrically connected between the PMOS transistor and the second node;
    the pair of second NMOS transistors is electrically connected between the NMOS transistor and the second node; and
    the pair of second PMOS transistors is electrically connected between the PMOS transistor and the first node.

7. The apparatus of claim 5, wherein:
    gates of the pair of first PMOS transistors and gates of the pair of second NMOS transistors are electrically connected to the first node; and
    gates of the pair of second PMOS transistors and gates of the pair of first NMOS transistors are electrically connected to the second node.

8. The apparatus of claim 1, wherein the half interlock latch circuit further includes a pair of access transistors configured to selectively electrically connect the first half and the second half of the half interlock latch circuit to a fuse responsive to assertion of gates of the pair of access transistors.

9. The apparatus of claim 8, wherein the first half and the second half of the half interlock latch circuit are configured to electrically isolate from a high voltage potential power node and a low voltage potential power node responsive to the assertion of the gates of the pair of access transistors.

10. The apparatus of claim 8, wherein the first half and the second half of the half interlock latch circuit are configured to electrically connect to a high voltage potential power node and a low voltage potential power node responsive to a deassertion of the gates of the pair of access transistors.

11. The apparatus of claim 1, wherein the half interlock latch circuit further comprises:

a first pair of parallel connected transistors including a first NMOS transistor and a first PMOS transistor; and a second pair of parallel connected transistors including a second NMOS transistor and a second PMOS transistor.

12. The apparatus of claim 11, wherein the half interlock latch circuit further comprises:
   a first node;
   a second node;
   a third node; and
   a fourth node, the first node and the second node configured to latch a logic level voltage potentials that are complementary to a logic level voltage potential that the third and fourth node are configured to latch.

13. The apparatus of claim 12, wherein:
   the first pair of parallel connected transistors are electrically connected between the first node and the second node;
   the second pair of parallel connected transistors are electrically connected between the third node and the fourth node;
   a gate of the first NMOS transistor is electrically connected to the third node;
   a gate of the first PMOS transistor is electrically connected to the fourth node;
   a gate of the second NMOS transistor is electrically connected to the second node; and
   a gate of the second PMOS transistor is electrically connected to the first node.

14. A method of operating a half interlock latch circuit, the method comprising:
   accessing a half interlock latch circuit electrically connected to a fuse;
   biasing the fuse to read a bit stored by the fuse;
   latching the bit read from the fuse to the half interlock latch circuit;
   terminating access to the half interlock latch circuit;
   operating half of the half interlock latch circuit in a high impedance state to resist a flip of the bit latched to the half interlock latch circuit; and
   reading the bit latched to the half interlock latch circuit.

15. The method of claim 14, further comprising operating two pairs of parallel connected transistors in half on modes to further resist the flip of the bit latched to the half interlock latch circuit.

16. The method of claim 14, further comprising powering the half interlock latch circuit responsive to the termination of access to the half interlock latch circuit.

17. The method of claim 14, further comprising isolating the half interlock latch circuit from power responsive to the access of the half interlock latch circuit.

18. A computing system, comprising:
   a half interlock latch circuit including:
      a first node;
      a second node;
      a pair of first N-type metal oxide semiconductor (NMOS) transistors electrically connected in series, the pair of first NMOS transistors electrically connected between the first node and a low voltage potential power supply node;
      a pair of first P-type metal oxide semiconductor (PMOS) transistors electrically connected in series, the pair of first PMOS transistors electrically connected between the second node and a high voltage potential power supply node;
      a pair of second NMOS transistors electrically connected in series, the pair of second NMOS transistors electrically connected between the low voltage potential power supply node and the second node; and
      a pair of second PMOS transistors electrically connected in series, the pair of second PMOS transistors electrically connected between the high voltage potential power supply node and the first node.

19. The computing system of claim 18, further comprising one or more memory devices including a fuse array, at least one fuse cell of the fuse array including the half interlock latch circuit.

20. The computing system of claim 18, further comprising:
   one or more processors;
   one or more non-volatile data storage devices operably coupled to the one or more processors;
   one or more memory devices operably coupled to the one or more processors;
   one or more input devices operably coupled to the one or more processors; and
   one or more output devices operably coupled to the one or more processors;
   wherein at least one of the one or more processors, the one or more non-volatile data storage devices, the one or more input devices, or the one or more output devices includes the half interlock latch circuit.

\* \* \* \* \*

UNITED STATES PATENT AND TRADEMARK OFFICE
CERTIFICATE OF CORRECTION

PATENT NO. : 10,937,515 B1
APPLICATION NO. : 16/794860
DATED : March 2, 2021
INVENTOR(S) : He et al.

Page 1 of 1

It is certified that error appears in the above-identified patent and that said Letters Patent is hereby corrected as shown below:

In the Specification
Column 14,   Line 43,   change "400" to --600--
Column 15,   Line 60,   change "400" to --600--
Column 16,   Line 7,    change "400" to --600--

Signed and Sealed this
Twentieth Day of April, 2021

Drew Hirshfeld
*Performing the Functions and Duties of the*
*Under Secretary of Commerce for Intellectual Property and*
*Director of the United States Patent and Trademark Office*